(12) United States Patent
Laity

(10) Patent No.: US 6,488,542 B2
(45) Date of Patent: *Dec. 3, 2002

(54) TYPE III PCMCIA CARD WITH INTEGRATED RECEPTACLES FOR RECEIVING STANDARD COMMUNICATIONS PLUGS

(75) Inventor: Ian A. Laity, Simi Valley, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/730,101

(22) Filed: Dec. 5, 2000

(65) Prior Publication Data

US 2001/0000161 A1 Apr. 5, 2001

Related U.S. Application Data

(63) Continuation of application No. 09/584,070, filed on May 31, 2000, now Pat. No. 6,183,308, which is a continuation of application No. 09/048,143, filed on Mar. 25, 1998, now Pat. No. 6,116,962, which is a continuation-in-part of application No. 08/971,501, filed on Nov. 17, 1997, now Pat. No. 5,984,731.

(51) Int. Cl.[7] ............................................... H01R 23/02
(52) U.S. Cl. ..................... 439/676; 439/76.1; 439/638; 439/946; 361/686; 361/737
(58) Field of Search ................................ 439/676, 76.1, 439/638, 946, 946.2, 344; 361/686, 737 785

(56) References Cited

U.S. PATENT DOCUMENTS

| 4,103,985 | A | 8/1978 | Krolak et al. ............ 339/126 R |
| 4,242,721 | A | 12/1980 | Krolak et al. ................ 361/415 |
| 4,303,296 | A | 12/1981 | Spaulding ............... 339/122 R |
| 4,734,043 | A | 3/1988 | Emert et al. ................. 439/676 |

(List continued on next page.)

FOREIGN PATENT DOCUMENTS

| CA | 2101354 | 1/1994 |
| DE | 29607724 | 8/1996 |

(List continued on next page.)

OTHER PUBLICATIONS

Duel Systems Drawing No. 31068–05, Ref. 2, entitled "Type III–68 Pin Connector, RJ11 and RJ48, 6 and 8 Positions" (3 sheets).

*Primary Examiner*—Tho D. Ta
(74) *Attorney, Agent, or Firm*—Kenneth J. Cool

(57) ABSTRACT

A Type III PCMCIA communications card for insertion in a slot in a host computer comprises a housing including a top wall and longitudinal, parallel side walls depending from the top wall, the longitudinal side walls and top wall defining an internal cavity enclosed by a bottom cover panel. The housing further has a forward end, a rear margin and a rear end surface, the rear margin of the housing defining at least one substantially longitudinally oriented receptacle extending forwardly from the rear end surface and sized and configured to receive a standard RJ-type modular plug. A substrate, mounted within the cavity of the housing, supports electronic components for carrying out the communications function. The substrate has a rear margin carrying a contact block including a plurality of contact wires, each contact wire having a first portion connected to components on the substrate, and a second portion extending into the at least one receptacle, the second portion of the contact wire being shaped and positioned for engagement with a corresponding contact on the connector plug. A connector provided at the forward end of the housing is adapted to be received by a corresponding connector within the slot of the host computer. The card has an overall height not exceeding approximately 10.5 mm, the communications card being directly connectable to a digital information system such as a LAN or a telephone line system utilizing standard RJ-type connectors.

39 Claims, 16 Drawing Sheets

U.S. PATENT DOCUMENTS

| | | | | |
|---|---|---|---|---|
| 5,183,404 | A | 2/1993 | Aldous et al. | 439/55 |
| 5,244,397 | A | 9/1993 | Anhalt | 439/101 |
| 5,336,099 | A | 8/1994 | Aldous et al. | 439/131 |
| 5,338,210 | A | 8/1994 | Beckham et al. | 439/131 |
| 5,386,340 | A | 1/1995 | Kurz | 361/737 |
| 5,391,083 | A | 2/1995 | Roebuck et al. | 439/76 |
| 5,391,094 | A | 2/1995 | Kakinoki et al. | 439/638 |
| 5,395,268 | A | 3/1995 | Okada | 439/676 |
| 5,411,405 | A | 5/1995 | McDaniels et al. | 439/131 |
| 5,457,601 | A | 10/1995 | Georgopulos et al. | 361/686 |
| 5,477,418 | A | 12/1995 | MacGregor et al. | 361/737 |
| 5,499,923 | A | 3/1996 | Archibald et al. | 349/26 |
| 5,505,633 | A | 4/1996 | Broadbent | 439/329 |
| 5,509,811 | A | 4/1996 | Homic | 439/55 |
| 5,532,898 | A | 7/1996 | Price | 361/119 |
| 5,538,442 | A | 7/1996 | Okada | 439/676 |
| 5,547,401 | A | 8/1996 | Aldous et al. | 439/676 |
| 5,548,483 | A | 8/1996 | Feldman | 361/737 |
| 5,561,727 | A | 10/1996 | Akita et al. | 385/88 |
| 5,562,463 | A | 10/1996 | Tan | 439/76.1 |
| 5,562,504 | A | 10/1996 | Moshayedi | 439/638 |
| 5,608,606 | A | 3/1997 | Blaney | 461/686 |
| 5,608,607 | A | 3/1997 | Dittmer | 361/686 |
| 5,611,055 | A | 3/1997 | Krishan et al. | 395/281 |
| 5,619,396 | A | 4/1997 | Gee et al. | 361/686 |
| 5,628,055 | A | 5/1997 | Stein | 455/89 |
| 5,634,802 | A | 6/1997 | Kerklaan | 439/131 |
| 5,637,018 | A | 6/1997 | Gargiulo | 439/640 |
| 5,702,271 | A | 12/1997 | Steinman | 439/676 |
| 5,735,712 | A | 4/1998 | Haas et al. | 439/676 |
| 5,773,332 | A | 6/1998 | Glad | 439/946 |
| 5,912,806 | A | 6/1999 | Onoda et al. | 439/946 |
| 6,012,953 | A * | 1/2000 | Francis | 439/676 |
| 6,146,209 | A * | 11/2000 | Francis | 439/676 |

FOREIGN PATENT DOCUMENTS

| | | |
|---|---|---|
| JP | 197652 | 6/1989 |
| JP | 8162233 | 6/1996 |
| WO | WO9513644 | 5/1995 |

\* cited by examiner

TYPE III PCMCIA CARD WITH INTEGRATED RECEPTACLES FOR RECEIVING STANDARD COMMUNICATIONS PLUGS

CROSS REFERENCES TO RELATED APPLICATIONS

This is a continuation of application Ser. No. 09/584,070 filed May 31, 2000 (now U.S. Pat. No. 6,183,308 B1 issued Feb. 6, 2001), which is a continuation of application Ser. No. 09/048,143 filed Mar. 25, 1998 (now U.S. Pat. No. 6,116,962 issued Sep. 12, 2000), which is a continuation-in-part of application Ser. No. 08/971,501 filed Nov. 17, 1997 (now U.S. Pat. No. 5,984,731 issued Nov. 16, 1999), which applications and patents are hereby incorporated by reference in their entireties.

FIELD OF THE INVENTION

This invention relates generally to removable input/output (I/O) devices of the type used with host systems such as desktop and portable personal computers, peripherals, and the like, for directly connecting the host system to an information transfer system using standard modular communications plugs.

BACKGROUND OF THE INVENTION

As is well known, many of today's laptop, notebook, desktop and other computers, as well as computer peripherals and other electronic products, are designed to receive removable devices such as cards conforming to standards established by the Personal Computer Memory Card International Association (PCMCIA). These standards define the electrical and physical specifications of the card including the interfaces between the card and the port or slot into which the card is inserted. The specifications include a 16-bit PC Card interface and a 32-bit CardBus interface. The PCMCIA standards also specify three card form factors, called Type I, Type II and Type III. All three card types measure the same length (85.6 mm) and the same width (54.0 mm), and differ only in overall thickness. Thus, the Type I card has a thickness of 3.3 mm; the Type II card, 5.0 mm; and the Type III card, 10.5 mm. PCMCIA cards may be used for various purposes. For example, Type I cards are typically used for memory devices; Type II cards are typically used for I/O devices, as will be described below; and Type III cards are typically used to house rotating mass storage devices (disk drives). Presently, Type II cards are used principally as communication links, for example, for connecting the user of a host system such as a portable computer to an Ethernet LAN, as a data/fax modem for connecting the user to a subscriber telephone line system, or as a combined LAN and modem card. In one popular arrangement, an adapter cable is used to couple the relatively thin Type II card to the much larger, standard RJ-11 or RJ-45 receptacle of a telephone line or Ethernet network. A drawback of this arrangement is that one or more bulky adapter cables must be carried (in addition to the computer) by the computer user in order to connect the computer to a LAN or telephone line system thereby defeating at least to some extent the advantages afforded by portable computers; also, these adapter cables are often lost. Another disadvantage of adapter cables is that the connection between the thin card and the cable is inherently fragile mechanically and subject to losses of electrical contact with a consequent loss of data transfer.

One solution to the problem of incompatibility between the PCMCIA Type II standard communications card and the RJ-type connector is to add to the rear end of the Type II card an enlarged housing enclosing a receptacle sized and configured to receive an RJ-type connector plug. The incorporation of such an RJ receptacle housing allows the 5 mm Type II communications card to interface directly with a LAN or telephone system using an existing LAN or telephone cable with an RJ-11 or RJ-45 modular plug at each end. However, although this approach eliminates the need for a separate adapter cable assembly, the housing on the end of the card for receiving the RJ-type connector projects from the host system enclosure often requiring the removal of the card when transporting a portable computer in an attache case or the like.

Another approach to the elimination of the need for external adapter cables is a communications card that allows an RJ-type modular plug to be inserted directly into an aperture formed in a retractable access portion of a Type II communications card. Such an approach is disclosed, for example, in U.S. Pat. No. 5,183,404 issued Feb. 2, 1993. Yet another approach to eliminating the need for adapter cables is disclosed in International Application No. PCT/US94/13106, published May 18, 1995 under the Patent Cooperation Treaty (PCT) as Publication No. WO 95/13633 (corresponding to U.S. Pat. No. 5,773,332). FIG. 21 of this PCT publication shows a Type III card incorporating in the rear thereof a pair of RJ-xx series receptacles (specifically RJ-11 and RJ-45) for directly connecting the card to a LAN network and/or telephone line.

An overall object of the present invention is to provide an improvement of the device disclosed in the aforementioned PCT publication.

SUMMARY OF THE INVENTION

In accordance with one specific, exemplary embodiment of the invention, there is provided a device adapted to be received by a port in a host system for connecting the host system to a digital information transfer system. The device comprises a housing having longitudinal sides, a transverse front end and a rear portion, at least the rear portion of the housing conforming substantially to the PCMCIA Type III thickness standard. A substrate enclosed within the housing carries circuit elements and a connector at the front end of the housing is connected to circuit elements on the substrate. The connector is adapted to be received by a corresponding connector within the slot of the host system. The rear portion of the housing defines at least one forwardly extending receptacle, the at least one receptacle including contact wires coupled to circuit elements on the substrate. The at least one receptacle is sized and configured to receive a standard RJ-type modular plug, the modular plug including contacts adapted to engage the contact wires in the at least one receptacle when the plug is inserted in the receptacle so that the device is adapted to be directly connectable to the digital information transfer system utilizing the standard RJ-type plug. The substrate includes a rear margin carrying a contact block having a plurality of contact wires. Each contact wire has a first terminal portion, or solder tail, connected to circuit elements on the substrate, and a second terminal portion extending into the at least one receptacle, the second terminal portion of the contact wire being shaped and positioned for engagement with a corresponding contact on the RJ-type modular plug.

In accordance with another aspect of the invention, the contact block comprises a base and a transversely extending, vertical wall mounted on the base. The wall has a front face, a rear face and a bottom face, and further includes at least one contact section adapted to make electrical connection with said at least one modular plug. The at least one contact section of the wall includes surfaces for retaining the contact wires against lateral displacement and further includes a recess in the bottom face. A plurality of shaped contact wires are carried by the contact block, each contact wire including portions engaging the contact wire retaining surfaces, each contact wire further including a first terminal portion or solder tail extending into the recess for connection to the substrate and a second terminal portion extending from the rear face of the wall, the second terminal portion being adapted to be engaged by a corresponding contact on the modular plug.

In accordance with yet another aspect of the invention, the first terminal portion or solder tail of each contact wire extends rearwardly within the associated recess and a portion of the rear face of the vertical wall of the contact block is shaped to facilitate access to the solder tail of each contact wire. Preferably, the shaped portion of the rear face of the vertical wall comprises a beveled surface.

The contact block is designed to minimize its encroachment on the adjacent substrate. Thus, the rearwardly extending solder tail of each contact wire is connected to the traces on the rear margin of the substrate as close as practicable to the rear edge thereof. After fabrication of the subassembly comprising the substrate and contact block, the recesses and beveled surfaces defined by the contact block wall facilitate inspection of the integrity of the solder joints connecting the contact wire solder tails to the substrate and provide sufficient space to permit resoldering if necessary.

In accordance with another aspect of the present invention, there is provided an improved enclosure for an I/O device adapted to be received by a port in a host system. The improved enclosure comprises a housing including a top wall and longitudinal, parallel side walls depending from the top wall, the longitudinal side walls and top wall defining an internal cavity for receiving a substrate carrying electronic components. The housing further has a forward end, a rear portion and a rear end surface, the rear portion defining at least one receptacle extending forwardly from the rear end surface and sized and configured to closely receive a standard RJ-type modular plug. At least the rear portion of the housing conforms substantially to the PCMCIA Type III thickness standard. A bottom cover panel encloses the cavity, the bottom cover panel including parallel, upwardly extending side flanges configured to nest within the side walls of the housing. In accordance with another feature of the improved I/O device enclosure, the side walls of the housing and the upwardly extending side flanges of the bottom cover panel are adapted to receive and retain longitudinal side margins of the substrate. The housing and bottom cover panel thereby define an enclosure maximizing the usable substrate surface area. Still further, the housing may comprise a one-piece, unitary molded plastic structure. Alternatively, to facilitate fabrication of the enclosure, the rear portion of the housing may constitute a receptacle body defining the at least one receptacle, the receptacle body and the remainder of the housing comprising separate, molded plastic structures bonded by sonic welding, for example, along mating joinder surfaces.

BRIEF DESCRIPTION OF THE DRAWINGS

Further objects, features and advantages of the invention will become evident from the detailed description below when read in conjunction with the accompanying drawings in which.

DETAILED DESCRIPTION OF THE PREFERRED EMBODIMENTS

Figure 1:
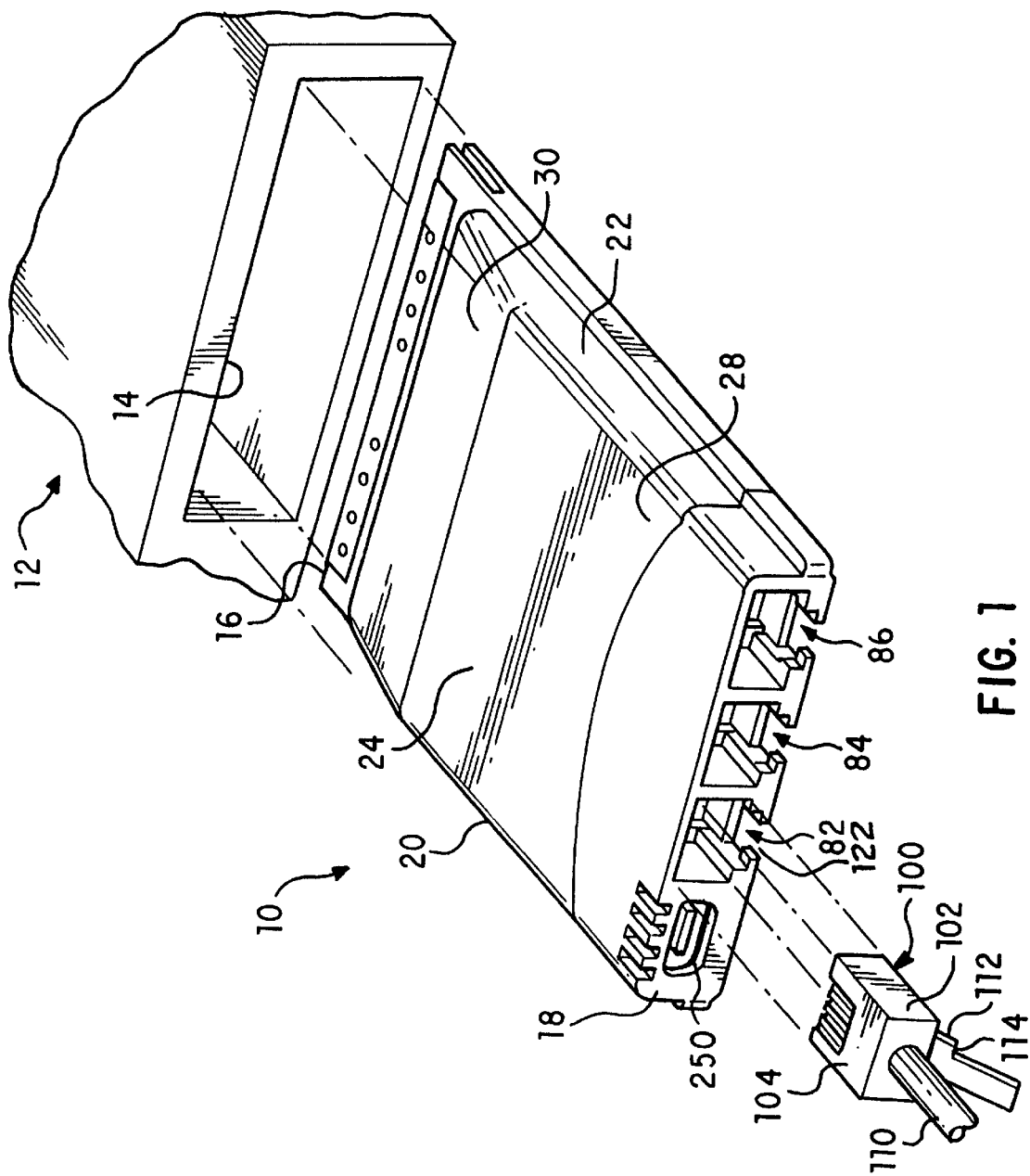
FIG. 1 is a perspective view of a device in accordance with the present invention for connecting a host system and an information transfer system, at least the rear portion of the device substantially conforming to the Type III PCMCIA thickness standard and incorporating receptacles for receiving standard connector plugs of the RJ and "slim D-sub" types.
Figure 2:
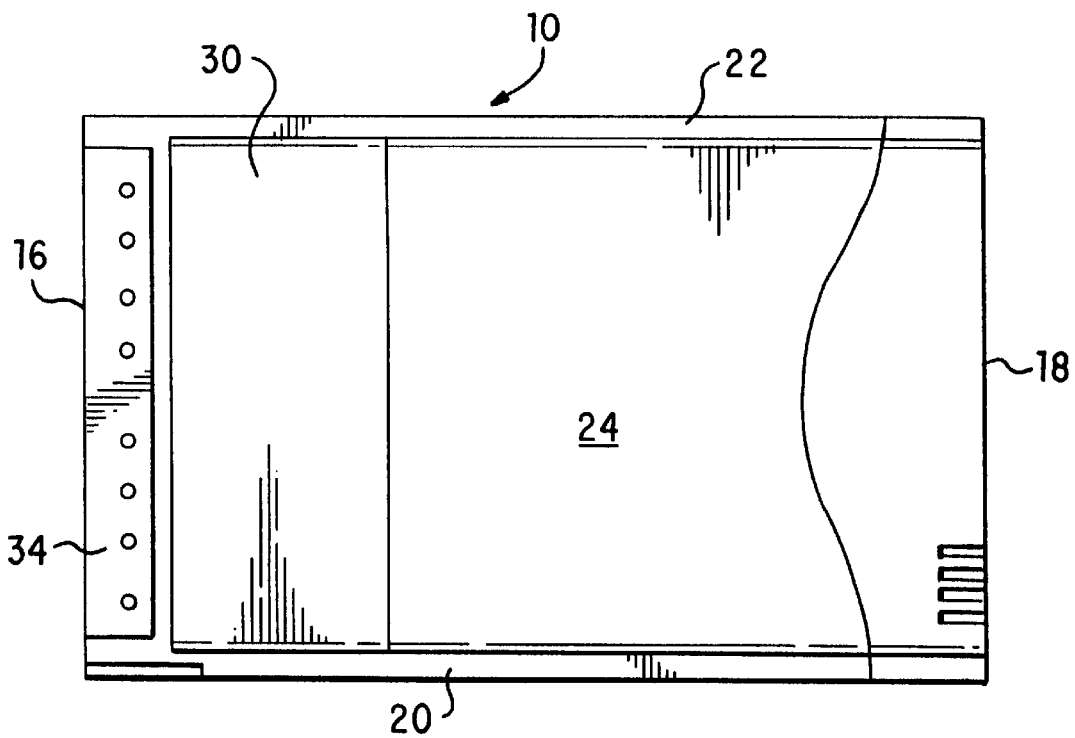
FIG. 2 is a top plan view of the device shown in FIG. 1.
Figure 3:
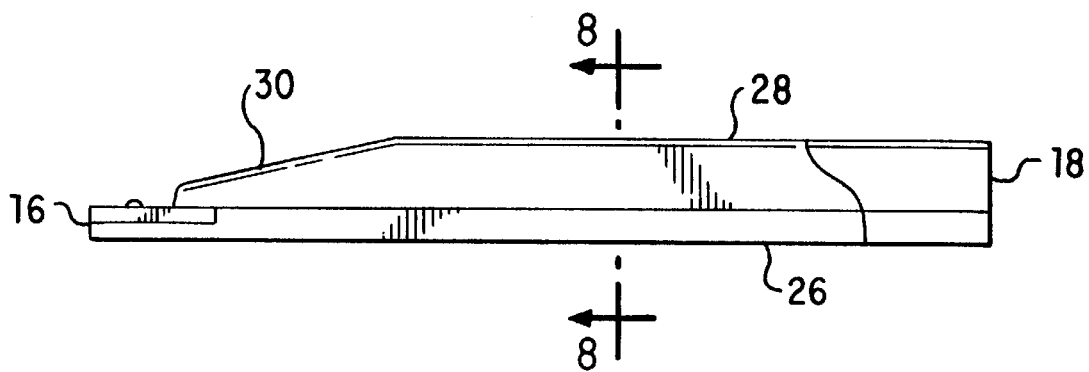
FIG. 3 is a side elevation view of the device shown in FIG. 1.
Figure 4:
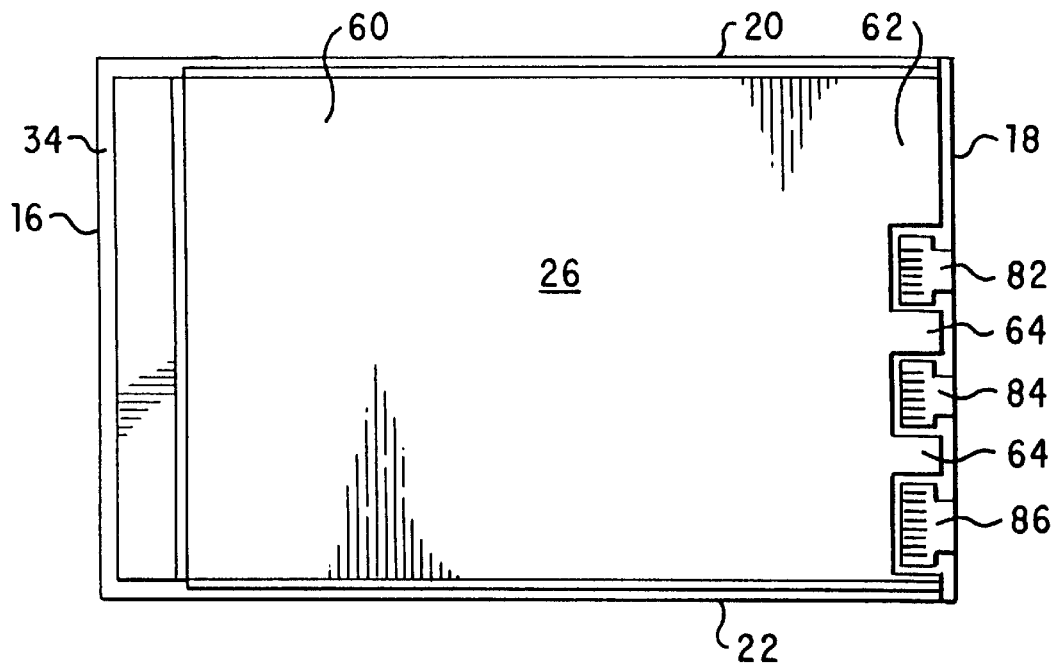
FIG. 4 is a bottom plan view of the device shown in FIG. 1.
Figure 5:
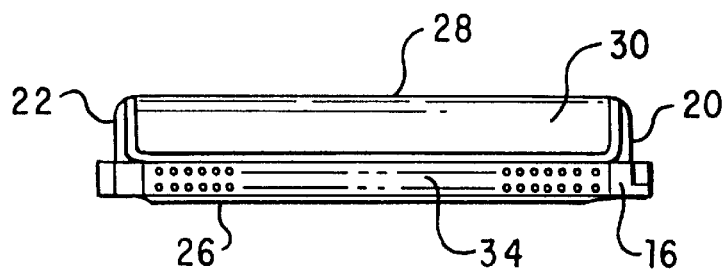
FIG. 5 is a front elevation view of the device shown in FIG. 1.
Figure 6:
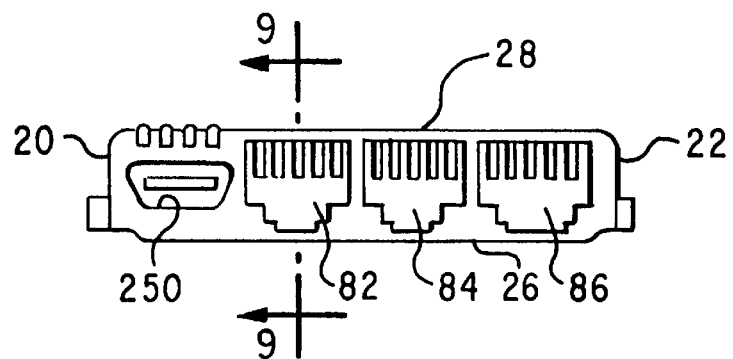
FIG. 6 is a rear elevation view of the device shown in FIG. 1.

It should be noted that terms such as "top", "bottom", "upper", "lower", "vertical", "horizontal", and the like, are used herein only to facilitate the description of the structure of the card illustrated; it will be evident that the card may be used in any orientation.

Although it will be evident to those skilled in the art that the removable I/O device of the present invention has broad utility, being usable with a wide variety of standard connector systems including both communication connector systems (for example, telephone and LAN) and non-communication connector systems (for example, video, coax, BNC, and so forth), the description of the invention will focus primarily on removable PCMCIA communication cards connectable to RJ-type standard modular connectors as a specific, exemplary context for the invention. By "RJ-type" standard modular connectors is meant RJ-11, RJ-45, and like modular connectors used, for example, for telephone line and LAN operations.

Referring to FIGS. 1–6, there is shown a preferred embodiment of the present invention comprising a PCMCIA card 10, conforming to the PCMCIA interface standard, and combining the functions of an Ethernet LAN adapter and a telephone line modem. The card 10 also supports various cellular wireless communication standards as will be described below. There is also shown (in FIG. 1) a host system 12, such as a desktop or portable computer, or computer peripheral, having a PCMCIA card port 14 for receiving the card 10.

The card 10 includes opposed, parallel, forward and rear ends 16 and 18, respectively, and parallel, longitudinal sides 20 and 22. The card 10 further has a top exterior surface 24 and a bottom exterior surface 26. The top surface 24 has a planar rear surface portion 28 parallel with the bottom surface 26 and a sloping or curved forward portion 30. It will be evident that the forward portion 30 of the top exterior surface 24 need not be sloped or curved; the entire top surface 24 of the card may simply comprise a flat surface extending forwardly from and coplanar with the planar rear surface portion 28.

In accordance with the physical standards established for all PCMCIA cards, the card 10 has a length of about 85.6 mm and a width of about 54.0 mm. The parallel top and bottom exterior surfaces 28 and 26 define an overall card thickness of about 10.5 mm in accordance with the Type III PCMCIA card form factor. In the specific embodiment under consideration, the forward end 16 of the card may have a thickness of about 5 mm matching that of a Type II card. (As is known, a Type III card port (such as the port 14) can accommodate two stacked Type II cards.)

Figure 7:
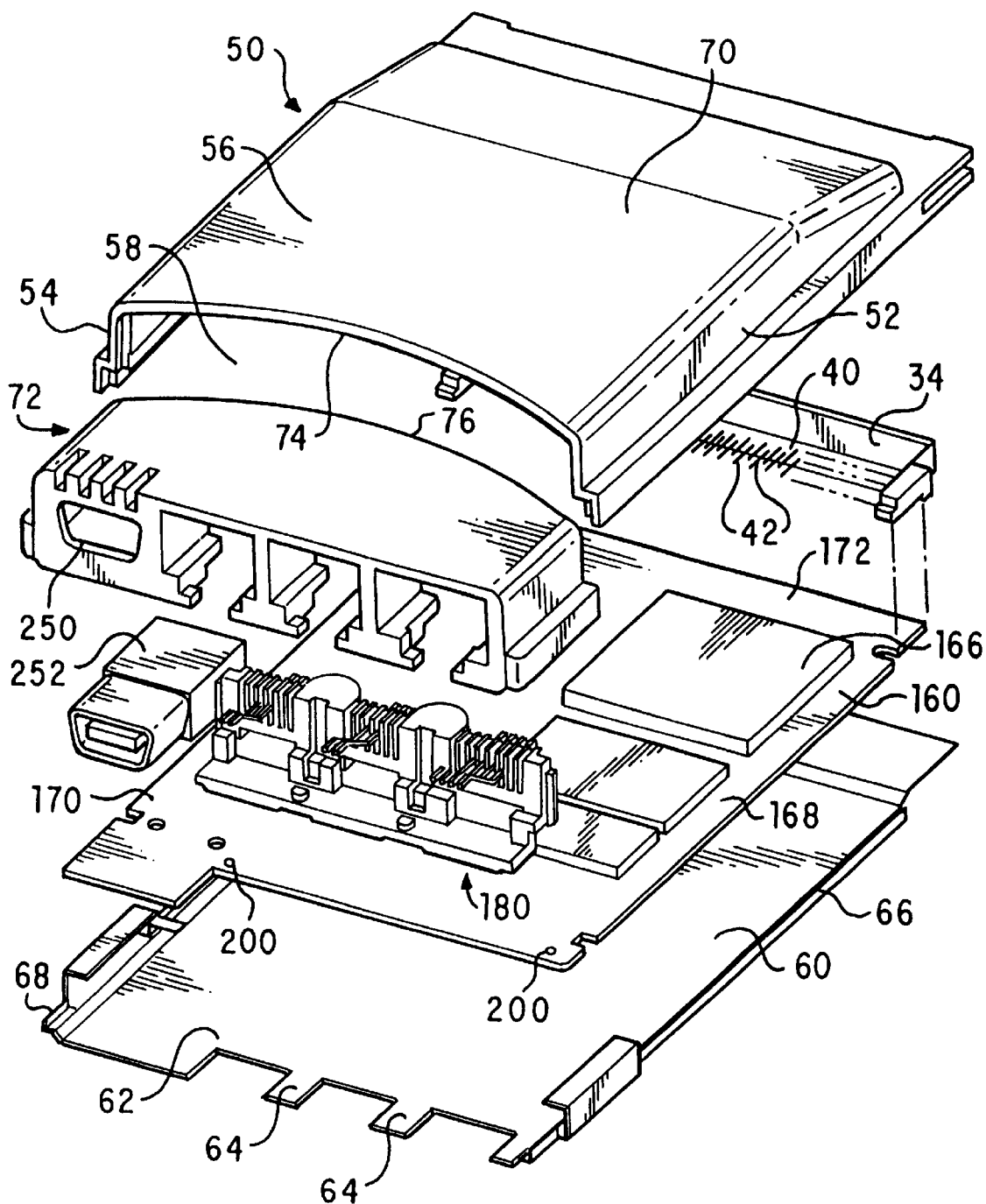
FIG. 7 is an exploded, perspective view of the device of FIG. 1 showing the major components thereof.

Disposed along the forward end 16 of the card 10 is a multicontact connector 34 designed to be removably coupled to a corresponding multipin connector (not shown) within the slot 14 in the host system 12. The connector 34 is made of molded plastic and, in accordance with the PCMCIA standard, includes sixty eight (68) contacts arranged in two rows of thirty four (34) contacts each. The connector contact and pin assignments are established by the PCMCIA interface standard. The connector 34 further includes a rear transverse face 40 from which contact leads 42 project (FIG. 7).

Figure 8:
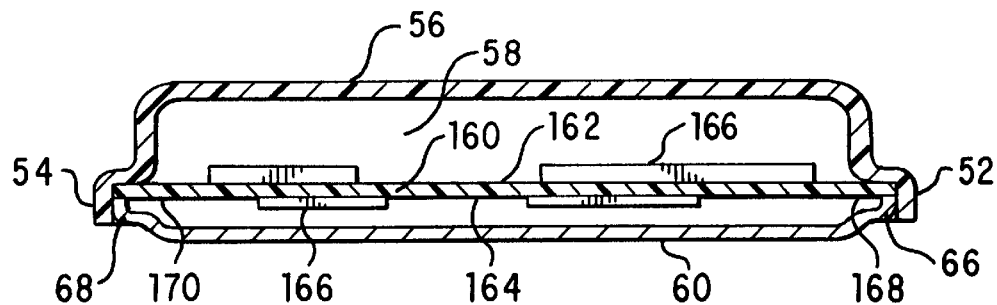
FIG. 8 is a transverse, cross section view of the device of the present invention, as seen along the line 8—8 in FIG. 3.

Referring now also to FIGS. 7–15, the card 10 is basically defined by a molded plastic housing 50 including longitudinal side walls 52 and 54 depending from a top wall 56. The walls 52, 54 and 56 define a central cavity 58 enclosed by a bottom sheet metal cover panel 60 having a rear margin 62 configured to define a pair of tabs 64, and upwardly extending side flanges 66 and 68 nested within the side walls 52 and 54 of the plastic housing 50 (FIG. 8).

In accordance with a preferred form of the invention, the housing 50 includes a front, molded plastic main housing part 70 and a separately molded, rear plastic receptacle body 72. The main housing part 70 and receptacle body 72 are permanently bonded, for example, by an adhesive or by sonic welding, along matching, arcuate joinder surfaces 74 and 76. The separate molding of the main housing part 70 and the receptacle body 72 facilitates manufacture, but it will be evident that alternatively, the housing part 70 and receptacle body 72 may be comolded, that is, molded as one piece to form a unitary housing 50.

The receptacle body 72, in the embodiment illustrated, includes four (4) sections 80, 82, 84 and 86 defined by longitudinally extending vertical walls 88, 90, 92, 94 and 96 and top wall 98. Sections 82, 84 and 86 comprise receptacles sized, configured and oriented to closely receive standard RJ-type modular connector plugs in a generally longitudinal insertion direction. Thus, by way of example and not limitation, each receptacle 82 and 84 is designed to receive a standard RJ-11 modular plug for direct connection to a telephone line for data/fax modem transmissions while the receptacle 86 is designed to receive a standard RJ-45 modular plug for direct connection to a LAN system. Although the RJ-45 plug is wider than the RJ-11 plug, the heights of these standard plugs are identical. The receptacle 84 can directly receive the RJ-11 plug on the end of an existing telephone line cable while the receptacle 82 can function as a pass-through and thus can be used, optionally, for connection to a modular telephone by means of an adapter telephone line having an RJ-11 modular plug on each end.

Figure 10:
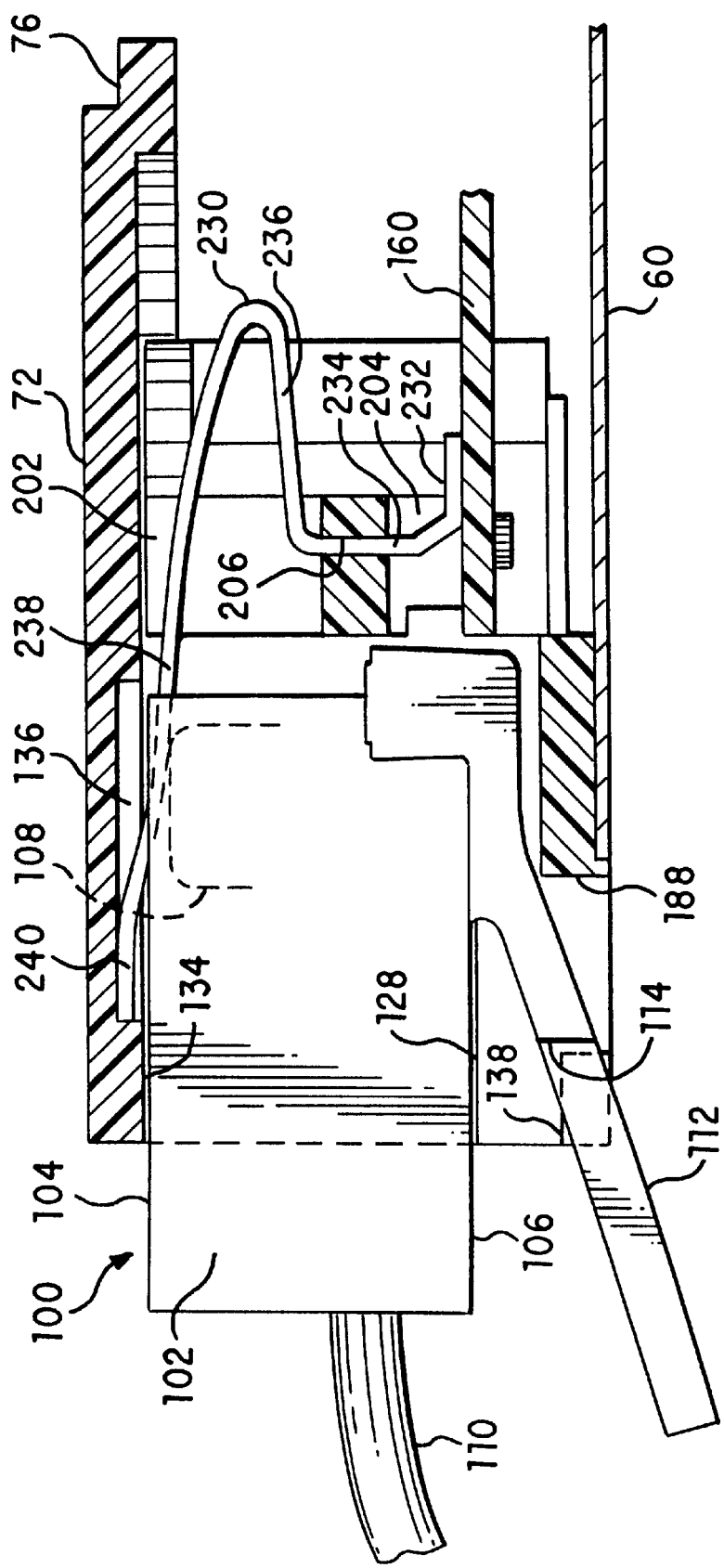
FIG. 10 is a side elevation view, in cross section, similar to FIG. 9, showing an RJ-type modular plug inserted in its associated receptacle.

By way of example, a conventional RJ-11 modular plug 100 for insertion in the receptacle 82 is shown in FIGS. 1 and 10. As is well known, the modular plug 100 includes a main rectangular body 102 having parallel top and bottom faces 104 and 106 and contact pins 108 connected to a multiconductor telephone cable 110 whose other end (not shown) has an identical RJ-11 modular plug. The standard plug 100 also includes a spring retention clip 112 having bilateral, transverse abutment surfaces 114.

The sizes and configurations of the receptacles 82, 84 and 86 are identical except that, as already noted, the width of the receptacle 86, which receives an RJ-45 modular plug, is greater than that of the receptacles 82 and 84 which each receive an RJ-11 plug. Accordingly, taking the receptacle 82 as typical of the three RJ receptacles of the preferred embodiment, the receptacle 82, which is defined by side walls 90 and 92 and top wall 98, has a modular plug access opening 120 along the rear end surface 18 of the card and an open or cutout bottom 122 having a T-shaped configuration. The side walls 90 and 92, at their lower ends, include inwardly directed flanges 124 and 126 defining ledges 128 and 130, respectively. The ledges 128 and 130, in conjunction with the top wall 98, define a channel 132 for receiving the main body 102 of the modular plug 100. The top wall 98 has an interior horizontal surface 134 including a plurality (six, in the case of receptacle 82) of uniformly spaced-apart, longitudinally extending grooves 136 for receiving the end portions of contact wires, as will be described below.

Figure 14:
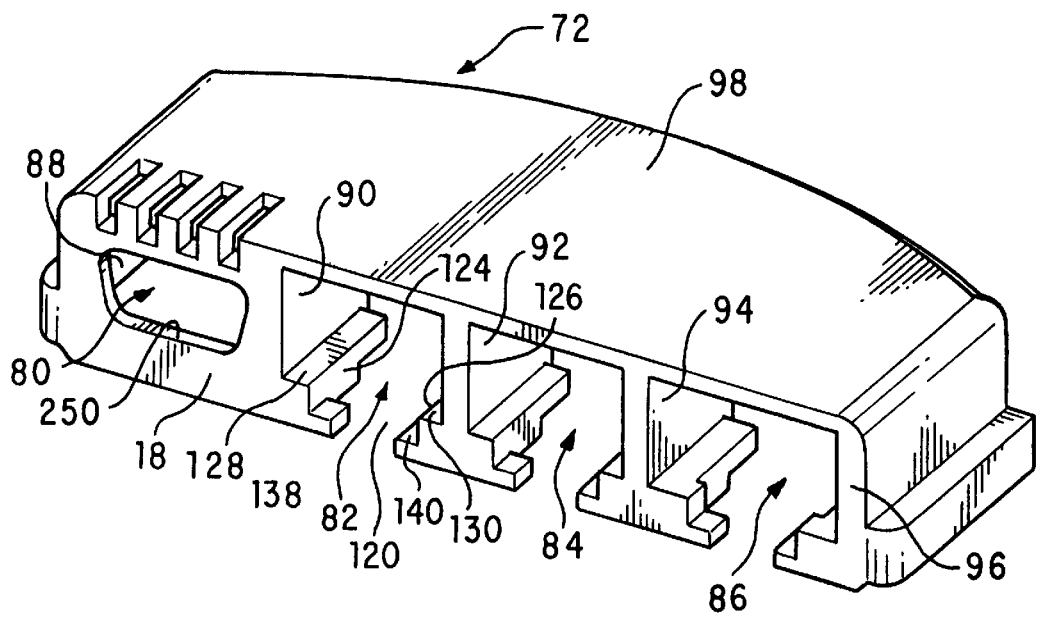
FIG. 14 is a perspective view of a specific embodiment of a receptacle body that may be utilized in the present invention.
Figure 15:
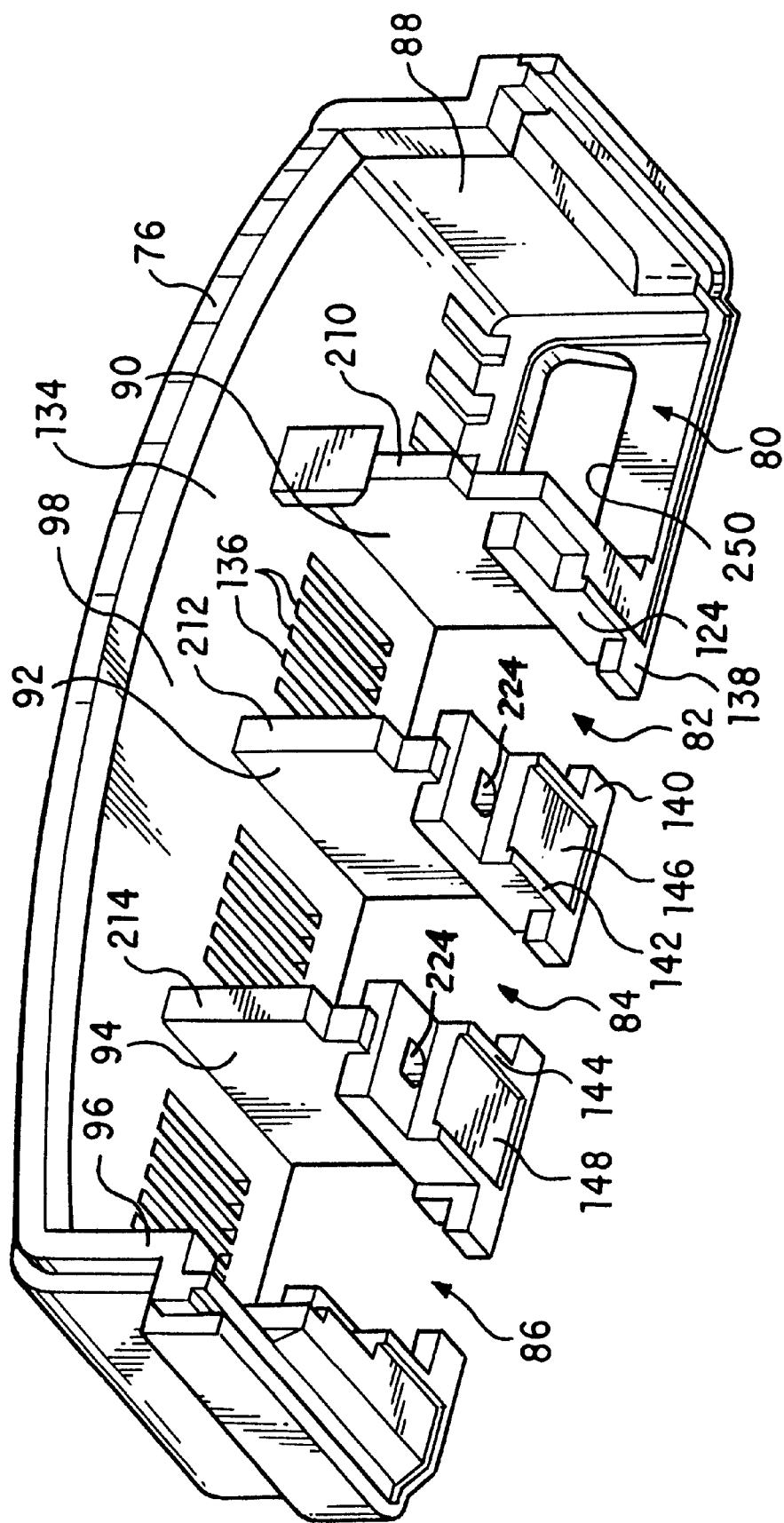
FIG. 15 is a another perspective view of the receptacle body shown in FIG. 14.

The representative receptacle 82 further includes an integrally molded pair of lugs 138 and 140 projecting inwardly from the flanges 124 and 126, respectively. As seen in FIGS. 14 and 15, for example, the inwardly directed flanges 124 and 126, together with the lugs 138 and 140, define the T-shaped opening or cutout 122 in the bottom of the receptacle 82. The lugs 138 and 140 are positioned for engagement by the abutment surfaces 114 on the retention clip 112 of the associated RJ modular plug 100. Thus, in a well known fashion, the abutment surfaces 114 on the retention clip 112 interact with the lugs 138 and 140 to lock the modular plug 100 into the receptacle 82 when the plug 100 is fully inserted, with the retention clip 112 projecting downwardly through the bottom opening 122 as best seen in FIG. 10. To minimize the depth of the receptacle 82, the lugs 138 and 140 are positioned at the rear extremity of the receptacle immediately adjacent the plug access opening 120.

With reference to FIG. 15, the walls 92 and 94 include lower surfaces 142 and 144, respectively, defining recesses 146 and 148 for receiving the tabs 64 along the rear margin 62 of the bottom cover panel 60.

Figure 11:
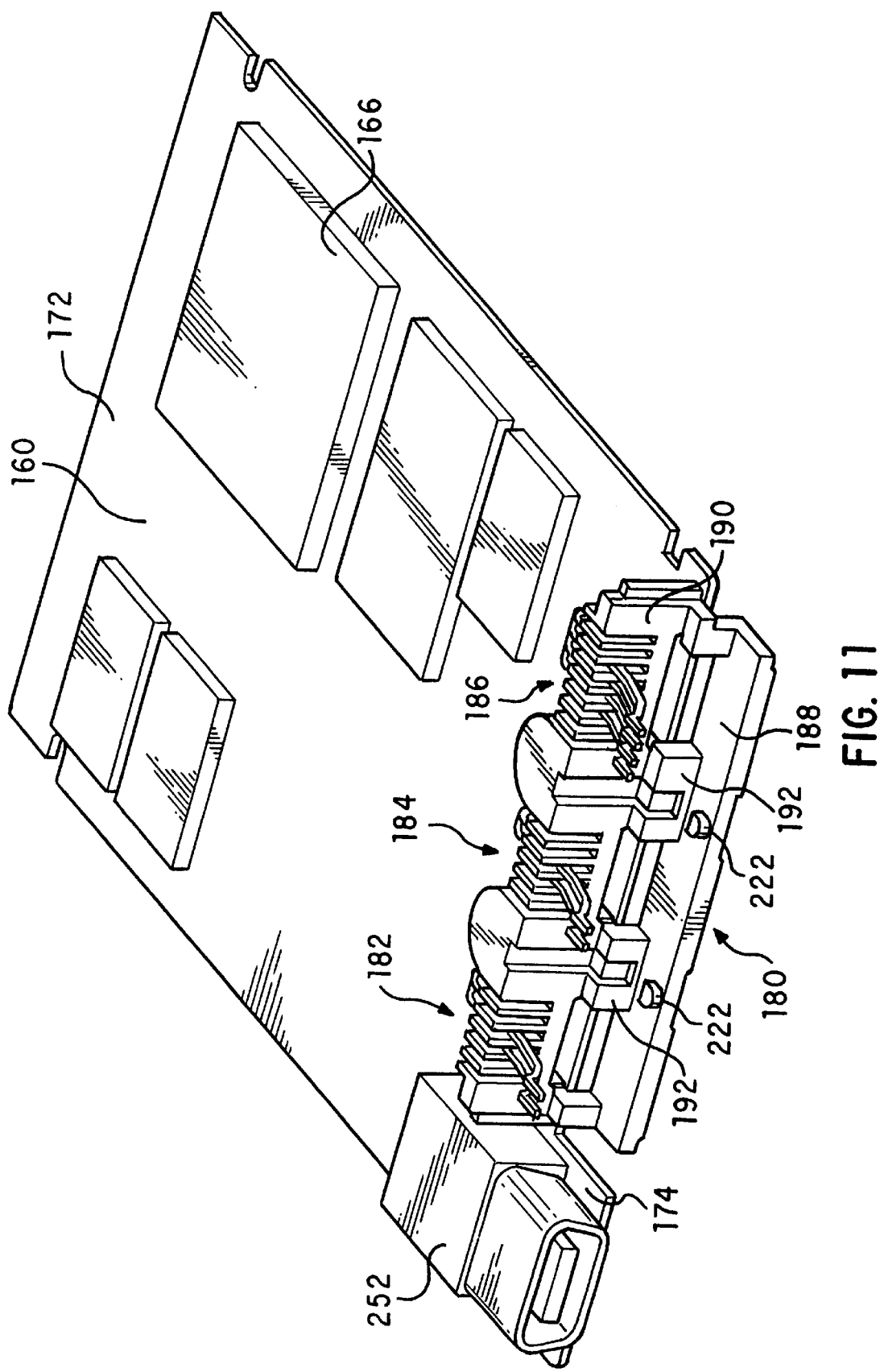
FIG. 11 is a perspective view of a subassembly of the device of FIG. 1, the subassembly including an electronic component substrate and a contact block and slim D-sub receptacle mounted along the rear margin of the substrate.

Disposed within the cavity 58 defined by the housing 50 is a substrate in the form of a printed circuit board assembly (PCBA) 160 having top and bottom surfaces 162 and 164 carrying integrated circuits and other electronic components, such as the components 166 shown schematically in FIGS. 7, 8 and 11. The PCBA 160 has longitudinal side margins 168 and 170 captured between the side walls 52 and 54 on the housing 50 and the flanges 62 and 64 of the bottom cover panel 60 (FIG. 8). As seen in FIG. 7, the card connector 34 is mounted along a forward margin 172 of the PCBA 160, the leads 42 from the connector 34 being soldered to a terminal section along the forward margin 172.

With reference to FIGS. 7 and 9–13, the PCBA 160 has a rear margin 174 along which is mounted a connector contact block 180 having three sections 182, 184 and 186 corresponding to the RJ connector receptacles 82, 84 and 86, respectively. The section 182 of the contact block 180 is representative of the RJ connector contact block sections. The contact block 180 may be supplied in tape and reel form and, using pick-and-place and surface mount technologies, connected to traces on the top surface 162 of the PCBA 160 along the rear margin 174 thereof (FIG. 11).

The contact block 180, preferably molded from plastic as a single piece, comprises a rearwardly projecting base 188, a transverse vertical wall 190, and posts 192 joining the base 188 and wall 190. The base 188 has a lower planar, recessed surface 194 to which the rear margin 62 of the bottom cover panel 60 is bonded. The vertical wall 190 of the contact block 180 has a lower extremity comprising a planar, horizontal PCBA abutment surface or bottom face 196 engaged by and bonded to the upper surface of the rear margin 174 of the PCBA 160. Locating pins 198 projecting from the abutment surface 196 are received by corresponding holes 200 in the PCBA 160 and serve to precisely position the contact block 180 relative to the PCBA. The portion of the wall 190 corresponding to representative section 182 of the contact block 180 has an upper part including a plurality of parallel, longitudinally oriented, equally spaced apart, contact wire guide slots 202. Generally, the portions of the wall 190 of the contact block sections 182 and 186 associated with the RJ-11 receptacles are provided with six (6) slots to accommodate up to as many contact wires, while the portion of the wall associated with the RJ-45 receptacle has eight (8) slots. Below the slots 202 is a recess 204 extending upwardly from the PCBA abutment surface 196. Each slot 202 communicates with the associated recess 204 via a vertical contact wire retention aperture 206.

As best seen in FIG. 15, the receptacle body vertical walls 90, 92 and 94 have front edges 210, 212 and 214 configured to be closely received by notches 216, 218 and 220 in the wall 190 and posts 192. Further, the base 188 of the contact block 180 has a pair of upstanding projections 222 adapted to be received by apertures 224 in the receptacle body 72.

Figure 9:
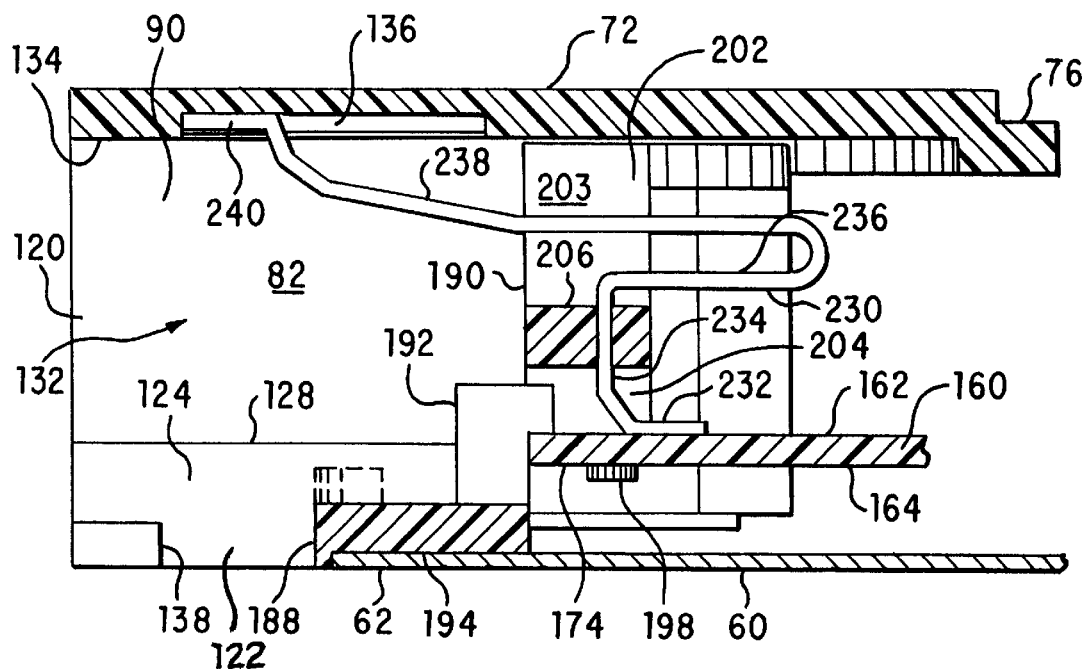
FIG. 9 is a side elevation view, in cross section, of the rear portion of the device of FIG. 1, as seen along the line 9—9 in FIG. 6, showing details of one of the RJ-type connector receptacles and an associated contact block.

When the receptacle body 72 and the contact block 180 are in their final, assembled configuration (FIG. 12), the slots 202 in the contact block wall 190 and the grooves 136 in the interior surface 134 of the top wall 98 of the receptacle body 72 are in longitudinal alignment. Thus, generally speaking, there will be a corresponding groove 136 for each slot 202. Each contact block section 182, 184 and 186 carries a plurality of contact wires. For example, the representative section 182 carries contact wires 230 each comprising a first terminal portion in the form of a horizontal solder tail 232 soldered to a trace along the upper surface of the rear margin 174 of the PCBA 160; a vertical run 234 extending through one of the contact wire retention apertures 206 into a corresponding slot 202; and a horizontal portion 236 extending forwardly from the slot 202. A second terminal portion 238 of the contact wire 230 is formed by bending the wire rearwardly as best seen in FIGS. 9, 10 and 13 from the horizontal portion 236 to form an angled spring biased contact for engagement by a corresponding contact pin 108 on the associated RJ modular plug 100. Each slot 202 is defined by laterally spaced apart, longitudinally extending, vertical surfaces 203 which restrain the associated contact wire against lateral movement. A rear extremity 240 of each contact wire 230 is captured by the corresponding groove 136 in the top wall 98 of the receptacle body 72 to stabilize its position and prevent damage to it upon insertion of the modular plug 100.

Figure 12:
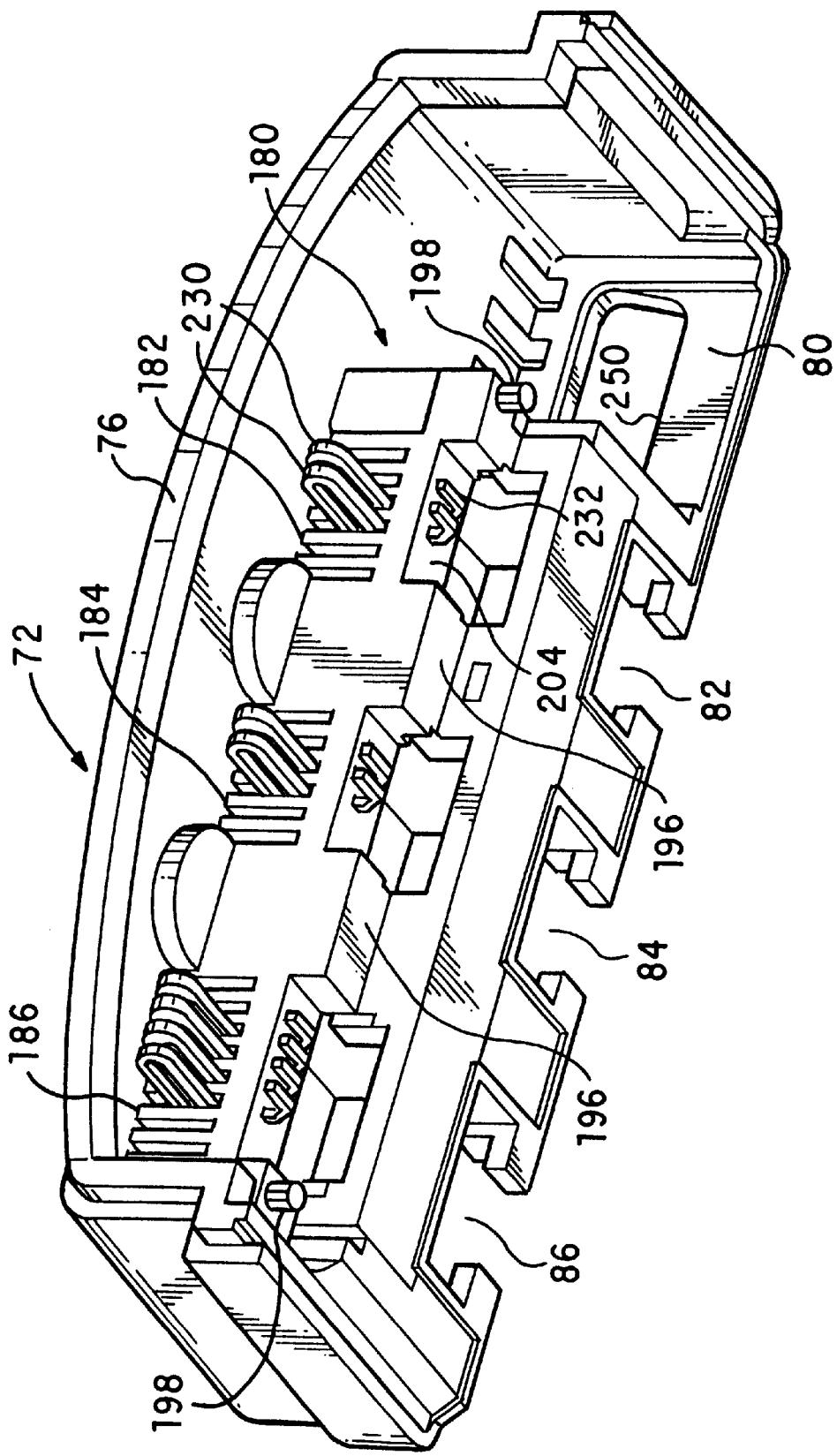
FIG. 12 is a perspective view of a subassembly of the device of FIG. 1, the illustrated subassembly comprising a receptacle body and mating contact block.
Figure 13:
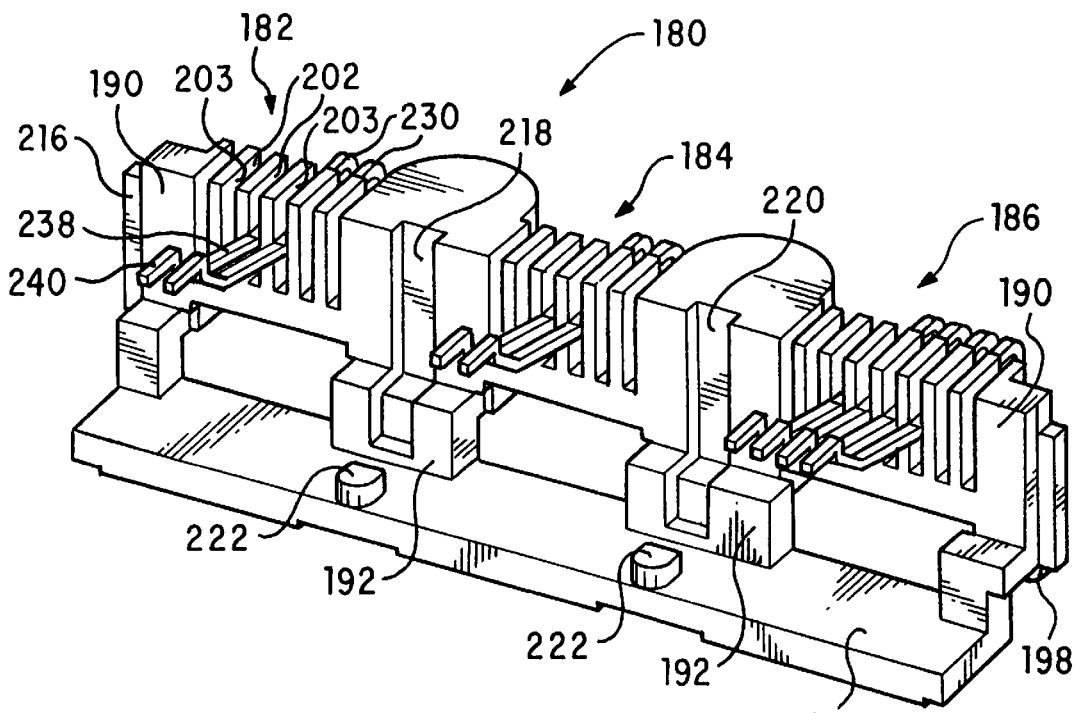
FIG. 13 is a perspective view of a specific embodiment of a contact block that may be utilized in the present invention.

As best seen in FIGS. 9, 10 and 12, the contact block 180 is designed to minimize its encroachment on the adjacent printed circuit board assembly 160. Thus, the forwardly extending solder tail 232 of each contact wire 230 is contained substantially within the longitudinal confines of the recess 204 and is connected to the traces on the rear margin 174 of the PCBA 160 as close as practicable to the rear edge of the PCBA. After fabrication of the subassembly shown in FIG. 11, the recesses 204 facilitate inspection of the integrity of the solder joints connecting the contact wire tails 232 to the PCBA and provide sufficient space to permit resoldering if necessary. Compact design is also afforded by bending the wire 230 forwardly to form the horizontal wire portion 236 and then rearwardly at an appropriate angle to provide a sufficiently long and therefore compliant rearwardly extending terminal portion 238. It will be seen that the portions of the contact wire 230 forward of the contact block 180 do not interfere with the PCBA or any of the devices carried thereby.

The rear end 18 of the card 10 also includes an opening 250 configured to receive a slim D-sub plug for coupling the host system 12 to a cellular telephone permitting wireless communications. A mating slim D-sub connector body 252, positioned to receive the slim D-sub plug, is mounted on the rear margin 174 of the PCBA adjacent the contact block in alignment with the opening 250.

Figure 22:
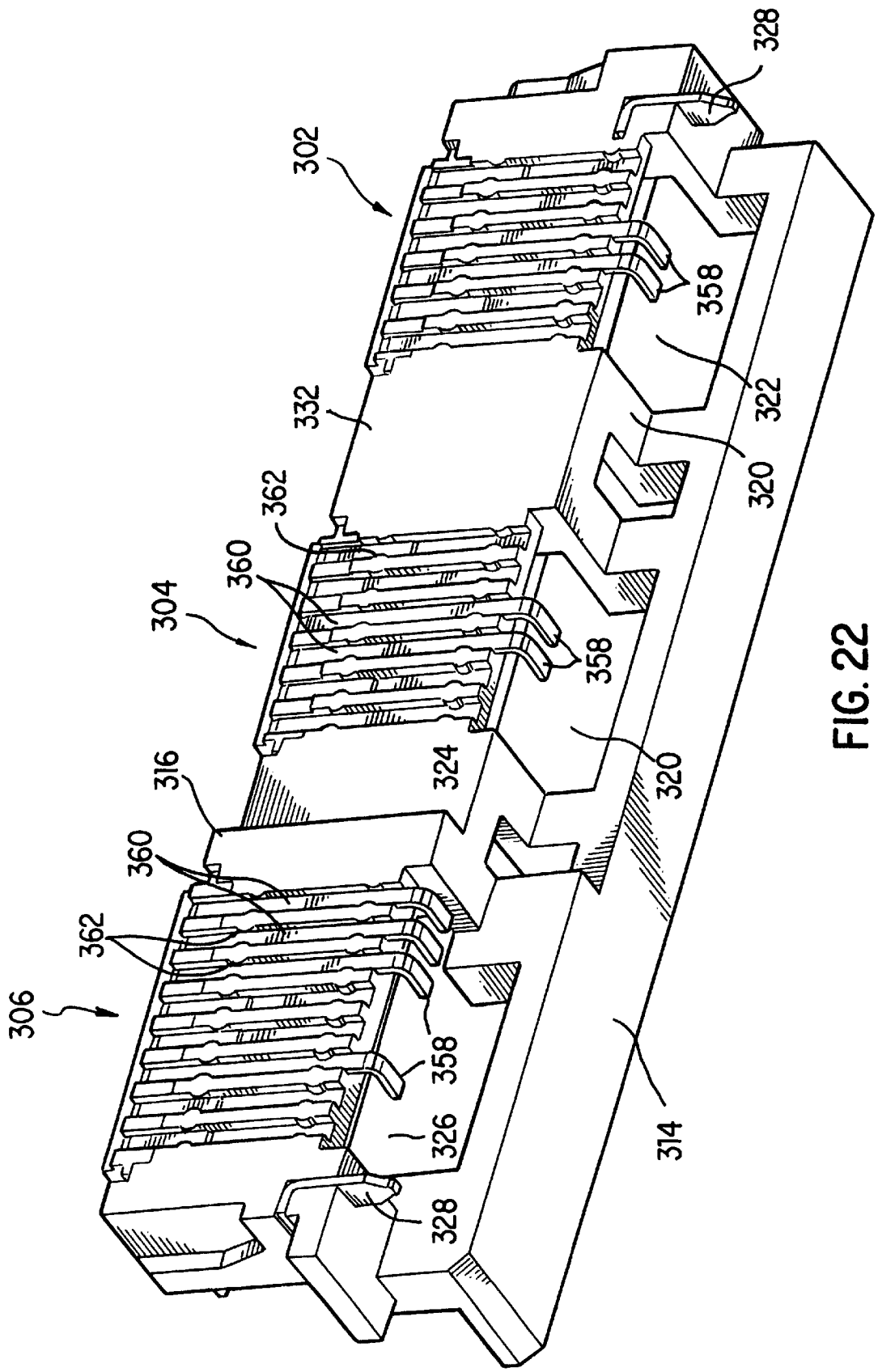
Figure 23:
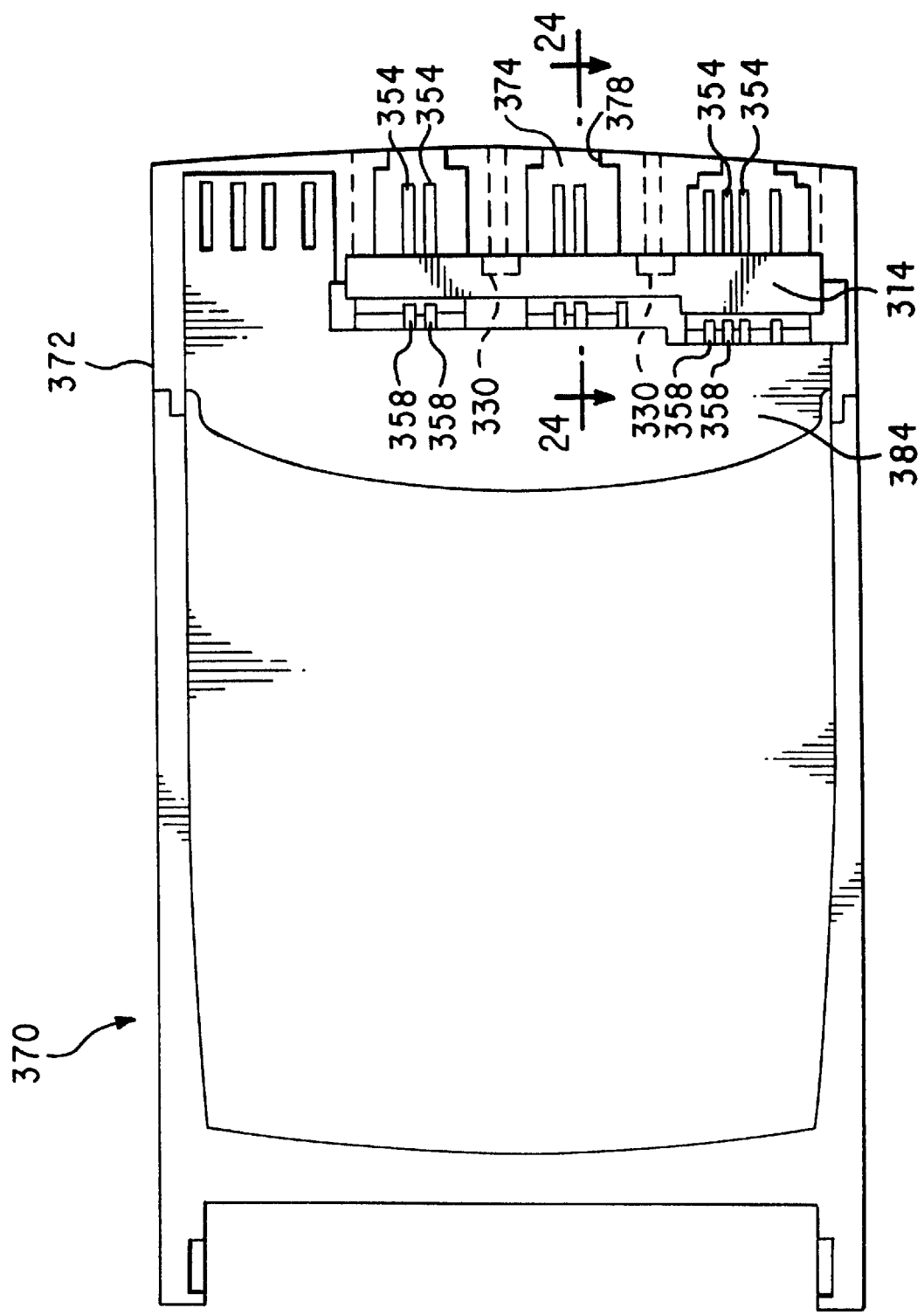
FIG. 23 is a bottom plan view of a housing in accordance with the invention incorporating the contact block of FIGS. 20–22, the housing being shown without the bottom cover, substrate or front connector.
Figure 24:
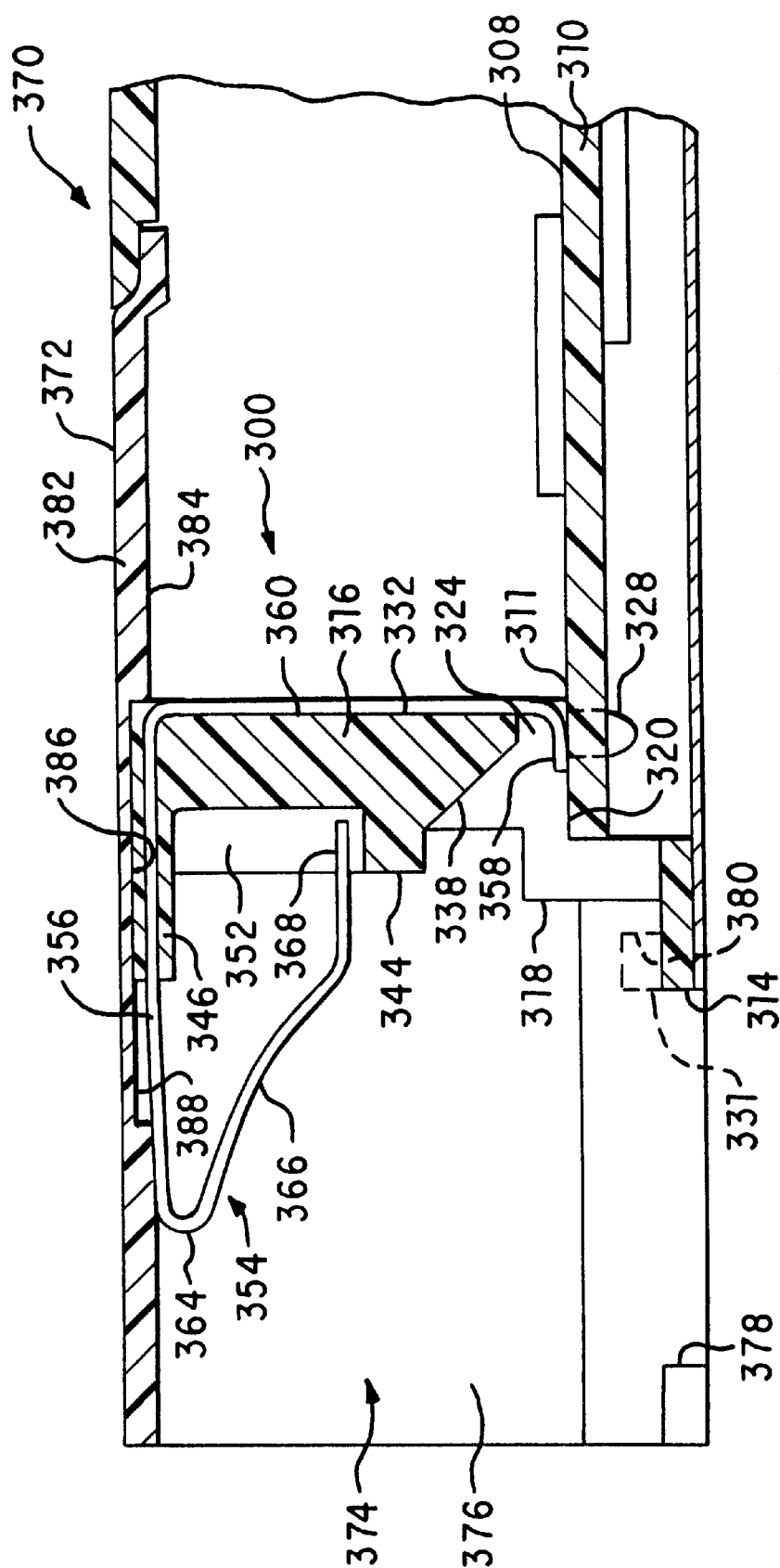
FIG. 24 is a side elevation view, in cross section, of the rear portion of the housing of FIG. 23 as seen along the line 24—24 in FIG. 23, with the bottom cover and substrate in place.

With reference to FIGS. 20–24 there is shown an alternative embodiment of a contact block identified by the reference numeral 300, having three connector sections 302, 304 and 306 corresponding to as many RJ connector receptacles as already described in connection with the embodiment of FIG. 13. The connector section 304 (through which the cross section of FIG. 24 is taken) is representative of the RJ connector contact block sections. As before, the contact block 300 may be supplied in tape and reel form and, using pick-and-place and surface mount technologies, connected to traces on the upper surface 308 of a substrate in the form of a PCBA 310 along the rear margin 311 thereof (FIG. 24).

The contact block 300 includes a main body 312 preferably molded from plastic as a single piece, and comprises a rearwardly projecting horizontal base 314, a transverse vertical wall 316 and posts 318 joining the base 314 and wall 316. The vertical wall 316 of the contact block has a lower extremity comprising a planar, horizontal PCBA abutment surface or bottom face 320 adapted to engage the upper surface 308 of the PCBA 310 along the rear margin 311 thereof. Associated with the connector sections 302, 304 and 306 are recesses 322, 324 and 326, respectively, formed in the wall 316 and extending upwardly from the bottom face 320 thereof. Metal locating pins 328, provided at the opposite ends of the contact block 300, project from the abutment surface 320. The pins 328 are received by corresponding holes in the PCBA 310 so as to precisely position the contact block 300 relative to the PCBA 310. The locating pins 328 may be soldered to the PCBA 310 to firmly secure the contact block 300 to the PCBA. The opposite ends of the contact block wall 316 includes mounting protuberances 330 and the base 314 includes a pair of projections 331.

Figure 20:
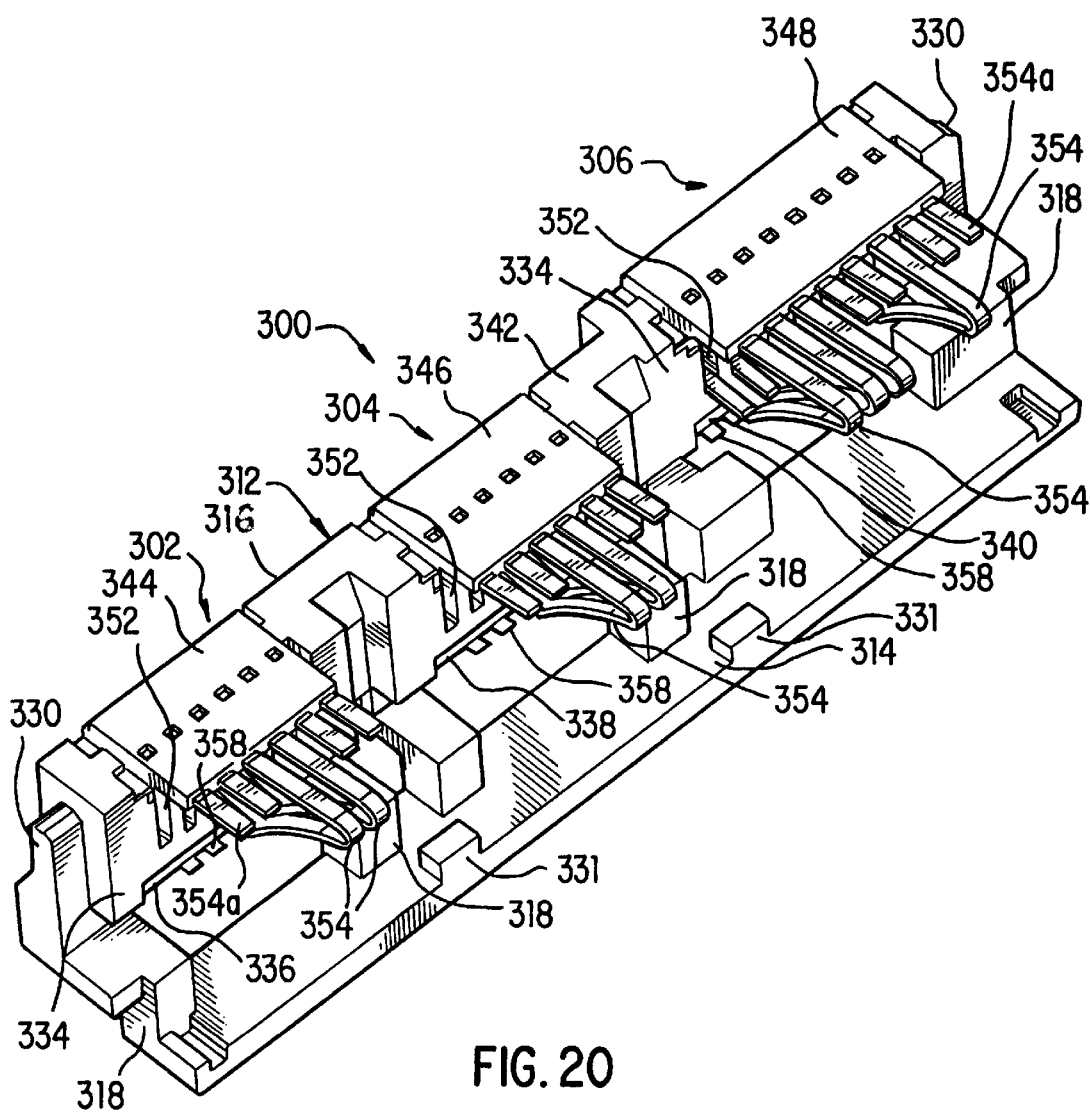
FIG. 20 is a rear perspective view of an alternative embodiment of a contact block that may be employed in the present invention.
Figure 21:
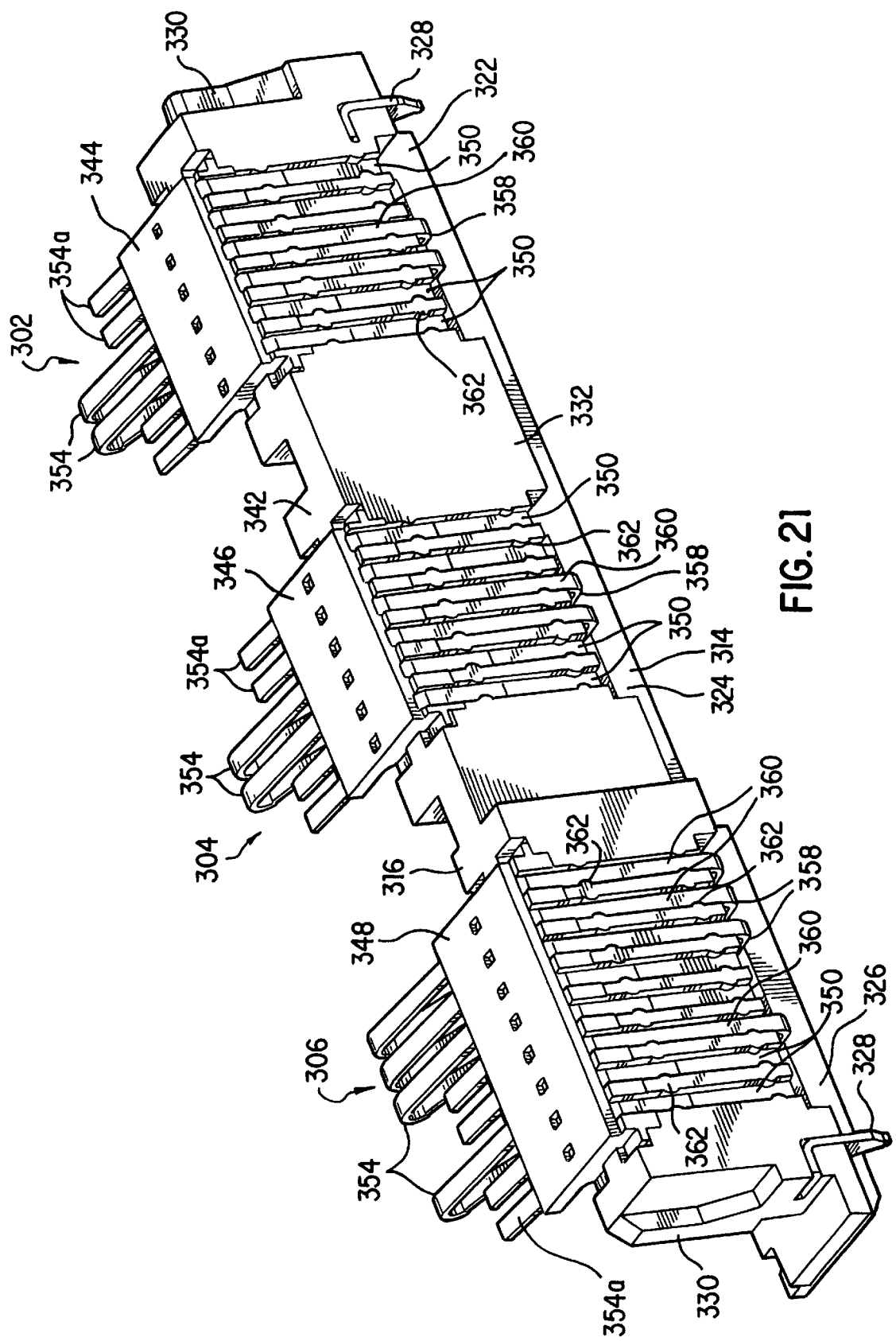
FIGS. 21 and 22 are front perspective views of the alternative contact block of FIG. 20.

The wall 316 includes vertical, transversely extending, parallel front face and rear faces 332 and 334, respectively. The rear face 334 of the wall 316 includes beveled surfaces 336, 338 and 340 adjacent the recesses 322, 324 and 326, respectively. The purpose of the beveled surfaces will be described below. The vertical wall 316 further includes a top surface 342 carrying three rearwardly projecting horizontal flanges 344, 346 and 348. As best seen in FIGS. 21 and 22, each section of the contact block 300 includes in the front face 332 thereof, a plurality of parallel, vertical grooves 350. Further, as seen in FIGS. 20 and 24, the rear face 334 includes in each section of the wall 316 a plurality of parallel, vertically extending slots or grooves 352 in longitudinal alignment with the grooves 350 in the front face 332 of the wall. As in the first embodiment of the contact block, each section of the contact block 300 includes a plurality of shaped contact wires 354. In the embodiment under consideration, the contact wires 354 are carried by the horizontal flanges 344, 346 and 348. Thus, each contact wire 354 includes a horizontal portion 356 part of which is embedded in the plastic forming the associated horizontal flange 344, 346 or 348. Each contact wire 354 further includes a rearwardly extending first terminal portion or solder tail 358 and a vertically extending portion 360 disposed within one of the vertical grooves 350 formed in the front face 332 of the wall. The vertically extending portion 360 of each contact wire 354 is held in place within the associated groove 350 by projections 362 extending inwardly within the groove and engaging the wire portion 360. Each contact wire 354 has a curved, rear extremity 364. From the rear extremity 364, the contact wire 354 is bent forwardly to define a gently curved second terminal portion 366 adapted to be engaged by a corresponding contact wire on the RJ-type modular plug adapted to be electrically connected to the contact block. The forwardly extending second terminal portion 366 of the contact wire 354 has a forward or free end 368 captured by one of the slots 352 formed in the rear face of the vertical wall. It will thus be seen that the second terminal portion 366 of each contact wire 354 is free to move up and down in response to insertion and retraction of a modular plug, the side walls of the slot 352 constraining lateral movement of the free end 368 of the contact wire. The second terminal portion 366 of the contact wire is so shaped and positioned, as best shown in FIG. 24, as to be firmly biased into electrical contact with a corresponding terminal or contact wire on the modular plug upon insertion thereof. The horizontal and vertical portions 356 and 360 of contact wires 354a that are not used are clipped during production of the contact block.

FIGS. 23 and 24 show somewhat schematically the manner in which the contact block 300 fits within a Type III card housing 370 in accordance with the invention. The housing 370 has a rear portion 372 defining receptacles, such as the receptacle 374, shaped and dimensioned to snugly receive an RJ-type modular plug. In this regard, there is provided a channel 376 formed in the rear portion 372 of the card housing along with appropriate lug means 378 adapted to be engaged, in a manner well known in the art, by the retention surfaces on the biased clip of the modular plug. As seen in FIG. 24, the rearwardly extending first terminal portion or solder tail 358 of each contact wire 354 engages the upper surface 308 of the PCBA 310 and is soldered, for example, by reflow soldering, to traces on the PCBA 310 along the rear margin 311 thereof. The recesses 322, 324 and 326 and the beveled surfaces 336, 338 and 340 defined by the wall 316 provide access to the solder tails 358 for inspection and manually touching up the solder joints, if necessary.

In assembling the contact block 300 and housing 370, the end protuberances 330 on the contact block are seated within sockets (not shown) molded as part of the rear portion 372 of the housing. Similarly, the projections 331 on the contact block base 314 are received within apertures 380 formed within the housing portion 372.

The rear portion 372 of the housing 370 includes a top wall 382 having an inner surface 384 provided with recesses and grooves for receiving the horizontal flanges 344, 346 and 348 and the horizontal portions of the contact wires 354. For example, as seen in FIG. 24, the portion of the inner surface 384 of the top wall 382 associated with the receptacle 374 has a rectangular recess 386 for receiving the horizontal flange 346 and grooves such as groove 388 for retaining the contact wire 354, stabilizing its position and preventing damage to it upon insertion of the modular plug. It will be seen that the contact block 300 and the solder tails 358 are so disposed as to be contained substantially within the confines of the recess 324 and connected to the traces on the rear margin 311 of the PCBA 310 as close as practicable to the rear edge thereof. Thus, encroachment of the contact block 300 on the PCBA is minimized.

The second terminal portion 366 of each contact wire 354 is bent at an appropriate angle to provide a sufficiently long and therefore compliant forwardly extending terminal portion. By directing the solder tails or first terminal portions 358 of the contact wires 354 rearwardly, there is no interference between any portion of the contact wires and the PCBA or any of the devices carried thereby.

It will thus be seen that the present invention successfully unites standard connectors and particularly RJ-type modular connectors, with the standard Type III PCMCIA card architecture without violating the constraints of either standard. Further, by providing an open bottom in the receptacle, the retention clip, in the fully inserted position of the modular plus is permitted to project outwardly from the lower, horizontal outer surface of the card. Accordingly, the 10.5 mm height of the Type III card can incorporate a receptacle conforming to the FCC RJ connector standards. At the same time, by placing the lugs at the rear extremity of the receptacle, the depth of the receptacle has been minimized, extending longitudinally, at most approximately 12 mm, so that encroachment on adjacent PCBA space is minimized.

It will be evident that although it is preferable to orient the receptacles so as to receive the associated plugs in a longitudinal insertion direction, the orientation of the receptacles can be varied so as to receive the mating plugs in a direction that departs from longitudinal to some extent, so long as the upper and lower faces of the plug are maintained substantially parallel with the upper and lower exterior surfaces of the receptacle-defining, rear portion of the device.

It further will be obvious that the receptacle body may be provided with various connector receptacle combinations besides the illustrated combination comprising an RJ-11 modem receptacle, an RJ-45 Ethernet receptacle, an RJ-11 pass-through and a slim D-sub connector receptacle. Alternatively, by way of example, the receptacle body could include an RJ-11 modem and pass-through receptacles; or a LAN RJ-45 receptacle only; and so forth.

Figure 17:
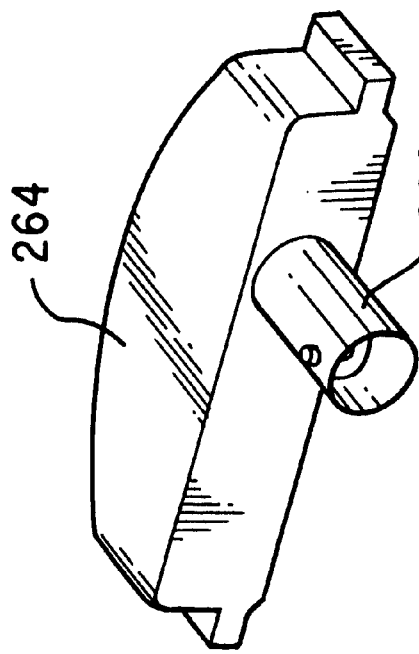
FIGS. 16–19 are perspective views of receptacle bodies in accordance with alternative embodiments of the invention.
Figure 19:
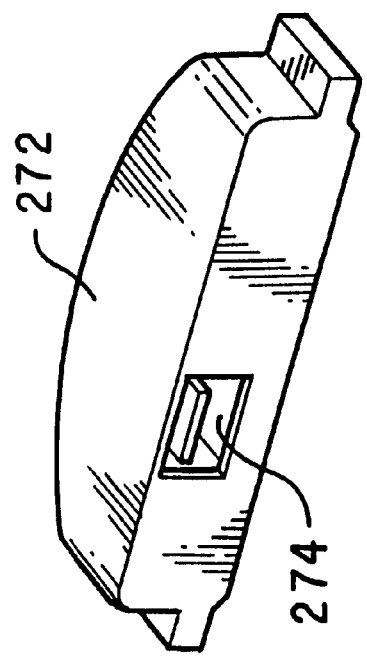
Figure 16:
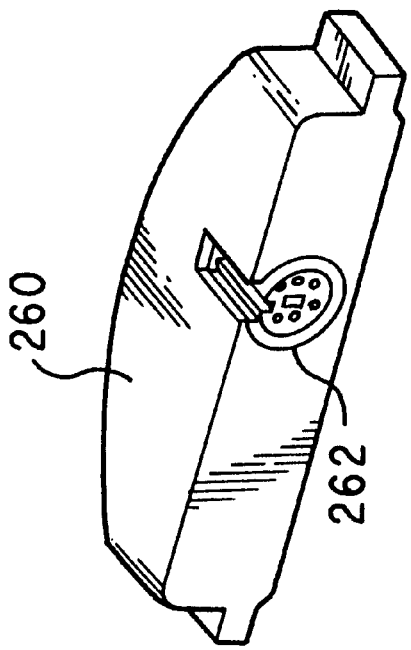
Figure 18:
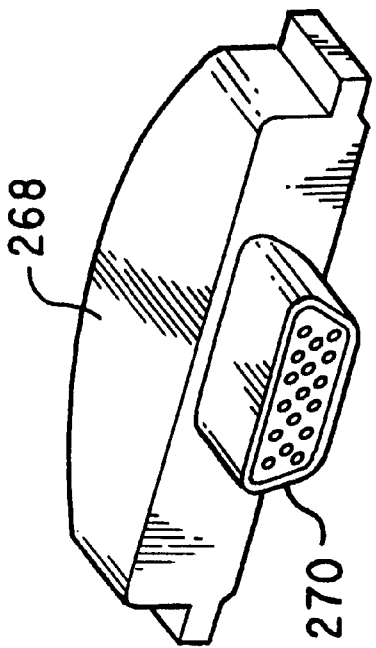

Further, the receptacle body can be adapted to connect the card to any one or more of a plurality of data or information transfer systems, U.S. and/or foreign. Thus, by way of example and not limitation, FIG. 16 shows a receptacle body 260 incorporating a mini-DIN connector receptacle 262; FIG. 17 depicts a receptacle body 264 housing a BNC/coax connector 266; FIG. 18 shows a receptacle body 268 supporting a D-sub connector 270; and FIG. 19 shows a receptacle body 272 including a USB (Universal Serial Bus) or IEEE-1394 connector 274. A particular receptacle body may thus incorporate any one or a combination of the standard connectors shown or other standard connectors of the many types known in the relevant industries, all within the Type III card form factor and particularly the 10.5 mm height limitation.

It will also be seen that the combination of the plastic housing and bottom cover panel together define a frameless card enclosure thereby maximizing the usable PCBA surface area.

While the present invention has been described with reference to particular illustrative embodiments, the invention is not intended to be restricted to those embodiments but only by the appended claims. It will be appreciated that those skilled in the art can change or modify the described embodiments, or substitute equivalents for the various elements described and shown, without departing from the scope and spirit of the invention. For example, it will be evident that the critical dimension is the cross section of the card, which cross section should not exceed the PCMCIA standards. The card length could be made somewhat longer than the PCMCIA card length of 85.0 mm although this is less desirable since additional length might project excessively from the host system.

What is claimed is:

1. A PCMCIA communication device for interfacing between an RJ-type connector plug and a host system, the communication device comprising:

an enclosure having a front portion, a rear portion and a bottom cover panel, the bottom cover panel having a bottom cover front part and a bottom cover rear part, said front portion of said enclosure comprising a front housing part and said bottom cover front part;

a substrate contained within said enclosure, said substrate carrying circuit components and including a substrate forward margin and a substrate rear margin, said substrate forward margin and said substrate rear margin including terminals connected to said circuit components on said substrate; and wherein said rear portion of said enclosure has an overall thickness conforming substantially to the standards set by the PCMCIA for Type III cards, wherein said enclosure is adapted to be received in a PCMCIA card slot of a host system, said rear portion of said enclosure further comprising a subassembly and said bottom cover rear part, said subassembly comprising at least one section including an opening configured to receive said RJ-type connector plug having at least two contacts, said at least one section further including at least two contact wires disposed at least partially within said opening, said at least two contact wires each having a first portion and a second portion, said first portion of each of said at least two contact wires formed to be aligned with and make electrical contact with one of said terminals formed on said substrate rear margin when said subassembly is attached to said substrate, said second portion of each of said at least two contact wires formed to be aligned with one of said at least two contacts in said RJ-type connector plug when said RJ type connector plug is inserted in said opening.

2. The PCMCIA communications device of claim 1 wherein:

said first portion of each of said contact wires is soldered to a terminal on said substrate rear margin.

3. The PCMCIA communications device of claim 1 wherein:

said subassembly comprises a contact block and a receptacle body assembled together to form said subassembly.

4. The PCMCIA communications device of claim 1 wherein:

said subassembly comprises at least two sections.

5. The PCMCIA communications device of claim 4 wherein:

each of said at least two sections includes an opening configured to receive an RJ-type connector plug having at least two contacts; and each of said at least two sections further includes at least two contact wires disposed at least partially within said opening; and said at least two contact wires in each of said at least two sections each has a first portion and a second portion, said first portion of each of said contact wires being formed to be aligned with and make electrical contact with one of said terminals formed on said substrate rear margin when said subassembly is attached to said substrate and said second portion of each of said contact wires being formed to be aligned with one of said at least two contacts of said RJ-type connector plug when said RJ-type connector plugs is inserted in said opening.

6. The PCMCIA communications device of claim 5 wherein:

at least one of said openings is configured to receive an RJ-11 connector plug.

7. The PCMCIA communications device of claim 5 wherein:

one of said openings is configured to receive an RJ-11 connector plug and an other of said openings is configured to receive an RJ-45 connector plug.

8. The PCMCIA communications device of claim 7 wherein:

said PCMCIA communication device further includes a slim D-sub connector including slim D-sub connector leads attached to terminals on said substrate rear margin; and said rear portion of said enclosure further includes an opening configured to receive a slim D-sub plug, said opening being in substantial alignment with said slim D-sub connector.

9. A communications device comprising:

a main housing part and a bottom cover panel;

a substrate carrying circuit components and including a substrate forward margin and a substrate rear margin, said substrate forward and substrate rear margins carrying a plurality of terminals connected to circuit components on said substrate;

a multicontact connector including sixty-eight connector contacts arranged in two rows of thirty four connector contacts each, said connector contacts including contact leads, a plurality of said contact leads being connected to at least some of said plurality of substrate terminals at said substrate forward margin, said substrate and said multicontact connector being disposed between said main housing part and said bottom cover panel; and a subassembly formed separately from said main housing part and having a thickness dimension conforming substantially to the standards set by the PCMCIA for Type III cards, said subassembly comprising at least one section including an opening configured to receive an RJ-type connector plug having at least two contacts, said at least one section further comprising at least two contact wires disposed at least partially within said opening, said at least two contact wires each having a first portion and a second portion, said subassembly being connected to said substrate such that said first portion of each of said contact wires is aligned with and makes electrical contact with one of said substrate rear margin terminals and said second portion of each of said contact wires is formed to be aligned with one of said two contacts in said RJ-type connector plug when said RJ-type connector plug is inserted in said opening.

10. The PCMCIA communications device of claim 9, wherein:

said main housing part and said subassembly each includes a joinder surface, said main housing part and said subassembly being joined together along said joinder surfaces.

11. A PCMCIA communications device for interfacing between an RJ-type connector plug and a host system, the communications device comprising:

an enclosure including a top housing and an opposed bottom sheet metal panel, the housing having a main portion and a rear portion, the rear portion of the housing comprising a receptacle body having a rear end surface and an overall thickness conforming substantially to the PCMCIA Type III standard, the main housing portion and the receptacle body being separately molded from plastic, and being joined along mating joinder surfaces on the main housing portion and the receptacle body;

a substrate contained within the enclosure, the substrate carrying circuit elements and including a front margin, a rear margin and a top surface, the substrate carrying a plurality of terminals on the top surface of the substrate along the rear margin thereof, said terminals being connected to circuit elements on the substrate;

a connector at the front margin of the substrate, the connector being connected to circuit elements on the substrate and adapted to mate with a corresponding connector on the host system;

at least one receptacle defined by the receptacle body, the at least one receptacle communicating with the rear end surface of the receptacle body, the at least one receptacle being sized and configured to receive the RJ-type connector plug having a plurality of contacts; and at least two contact wires associated with the at least one receptacle, each of the at least two contact wires having a first portion and a second portion, the first portion of each of the at least two contact wires including a horizontally extending portion electrically connected to one of the terminals along the rear margin of the substrate and the second portion of each of the at least two contact wires extending into the at least one receptacle and being shaped and positioned for engagement with a corresponding contact on the connector plug when the plug is inserted in the at least one receptacle.

12. The communications device of claim 11, in which:
the at least one receptacle is sized and configured to receive an RJ-11 connector plug.

13. The communications device of claim 11, in which:
the at least one receptacle is sized and configured to receive an RJ-45 connector plug.

14. The communications device of claim 11, in which:
the receptacle body defines at least two receptacles, said at least two receptacles being disposed in side-by-side relationship, each of the receptacles communicating with the rear end surface of the receptacle body and sized and configured to receive an RJ-type connector plug having a plurality of contacts.

15. The communications device of claim 14, in which:
one of the at least two receptacles is sized and configured to matingly receive an RJ-11 connector plug and another of the at least two receptacles is sized and configured to matingly receive an RJ-45 connector plug.

16. A communications device for use in a host system having a PCMCIA slot, the device being adapted to connect the host system to an information transfer system, the communications device comprising:

an enclosure including a housing having a front end and a rear portion, the rear portion of the housing including a receptacle body having a rear end and an overall thickness conforming substantially to the PCMCIA Type III standard;

a substrate contained within the enclosure, the substrate carrying circuit elements and including a rear margin carrying terminals connected to circuit elements on the substrate;

a connector at the front end of the housing connected to circuit elements on the substrate and adapted to mate with a corresponding connector within the slot of the host system;

a contact block attached to the receptacle body, the contact block carrying at least two contact wires; and a receptacle defined by the receptacle body, the receptacle being disposed between the rear end of the receptacle body and the contact block, the receptacle being sized and configured to receive an RJ-type connector plug having a plurality of contacts, each of the at least two contact wires carried by the contact block having a first portion connected to a terminal on the rear margin of the substrate and a second portion extending into the receptacle, the second portion of each contact wire being shaped and positioned for engagement with a corresponding contact on the connector plug when the plug is inserted in the receptacle, whereby the device is adapted to be directly connectable to the information transfer system utilizing the connector plug.

17. The communications device of claim 16, in which:
the substrate includes a top surface carrying the terminals on the rear margin of the substrate, the first portion of each of said contact wires including a horizontally extending portion electrically connected to one of said terminals.

18. The communications device of claim 16, in which:

the housing comprises a molded plastic structure and includes a top wall and side walls depending from the top wall, the top wall and side walls defining an internal cavity for receiving the substrate; and in which the enclosure includes:

a bottom sheet metal cover panel enclosing the cavity.

19. The communications device of claim 16, in which:

the housing includes a main housing part, the main housing part and the receptacle body being separately molded from plastic as one-piece, unitary structures, the main housing part and the receptacle body being joined along mating joinder surfaces on the main housing part and the receptacle body.

20. The communications device of claim 16, in which:

the receptacle is sized and configured to receive an RJ-11 connector plug.

21. The communications device of claim 16, in which:

the receptacle is sized configured to receive an RJ-45 connector plug.

22. A communications device for use in a host system having a PCMCIA slot, the device being adapted to transfer information to and from the host system, the communications device comprising:

an enclosure including a housing having a front end and a rear portion, the rear portion of the housing including a receptacle body having a rear end and an overall thickness conforming substantially to the PCMCIA Type III standard;

a substrate contained within the enclosure, the substrate carrying circuit elements and including a rear margin carrying terminals connected to circuit elements on the substrate;

a connector at the front end of the housing connected to circuit elements on the substrate and adapted to mate with a corresponding connector within the slot of the host system;

a contact block attached to the receptacle body, the contact block comprising first and second contact wire sections, each contact wire section carrying at least two contact wires; and a first receptacle and a second receptacle defined by the receptacle body, each receptacle being configured to receive an RJ-type connector plug having a plurality of contacts, the first and second receptacles being disposed in side-by-side relationship between the rear end of the receptacle body and the contact block, the first contact wire section of the contact block and the first receptacle being in alignment with each other and the second contact wire section of the contact block and the second receptacle being in alignment with each other, each of the at least two contact wires carried by the first contact wire section of the contact block having a first portion connected to a terminal on the rear margin of the substrate and a second portion extending into the first receptacle, the second portion of each contact wire being shaped and positioned for engagement with a corresponding contact on a connector plug when the plug is inserted in the first receptacle, each of the at least two contact wires carried by the second contact wire section of the contact block having a first portion connected to a terminal on the rear margin of the substrate and a second portion extending into the second receptacle, the second portion of each contact wire being shaped and positioned for engagement with a corresponding contact on a connector plug when the plug is inserted in the second receptacle.

23. The communications device of claim 22, in which:

the substrate includes a top surface carrying the terminals on the rear margin of the substrate, the first portion of each of said contact wires including a horizontally extending portion electrically connected to one of said terminals.

24. The communications device of claim 22, in which:

the housing is a molded plastic structure and includes a top wall and side walls depending from the top wall, the top wall and side walls defining an internal cavity for receiving the substrate; and in which the enclosure includes:

a bottom sheet metal cover panel enclosing the cavity.

25. The communications device of claim 22, in which:

the housing includes a main housing part, the main housing part and the receptacle body being separately molded from plastic as one-piece, unitary structures, the main housing part and the receptacle body being joined along mating joinder surfaces on the main housing part and the receptacle body.

26. An enclosure for a PCMCIA communications device adapted to be received by a PCMCIA slot in a host system, the enclosure comprising:

a housing including a front end, a top wall and side walls depending from the top wall, the top wall and the side walls defining an internal cavity for receiving a printed circuit board, the housing further having a main housing part and a rear portion, the rear portion comprising a receptacle body, the main housing part and the receptacle body being separately molded from plastic as one-piece, unitary structures, the main housing part and the receptacle body being joined along mating joinder surfaces, the receptacle body having a rear end surface, the receptacle body defining at least one receptacle communicating with the rear end surface of the receptacle body, the at least one receptacle being sized and configured to closely receive an RJ-type modular connector plug, at least the receptacle body conforming substantially to the PCMCIA Type III thickness standard; and a bottom metal cover panel enclosing the internal cavity.

27. The enclosure defined in claim 26, in which:

the at least one receptacle is sized and configured to receive an RJ-11 modular connector plug.

28. The enclosure defined in claim 26, in which:

the at least one receptacle is sized and configured to receive an RJ-45 modular connector plug.

29. The enclosure defined in claim 26, which further includes:

a contact block for carrying contact wires, the contact block being attached to the receptacle body forwardly of the at least one receptacle.

30. The enclosure defined in claim 26, in which:

the receptacle body defines a plurality of side-by-side receptacles, each of said plurality of receptacles being sized and configured to receive an RJ-type modular connector plug.

31. The enclosure defined in claim 30, in which:

said plurality of side-by-side receptacles includes two receptacles, one of the two receptacles being sized and configured to receive an RJ-11 modular connector plug and the other of the two receptacles being sized and configured to receive an RJ-45 modular connector plug.

32. The enclosure defined in claim 30, which further includes:

a contact block for carrying contact wires, the contact block being attached to the receptacle body forwardly of the plurality of receptacles, the contact block including a contact wire section associated with each one of the plurality of receptacles.

33. An enclosure for a PCMCIA communications device adapted to be received by a PCMCIA slot in a host system, the enclosure comprising:

a housing including a front end, a top wall and side walls depending from the top wall, the top wall and the side walls defining an internal cavity for receiving a printed circuit board, the housing further having a main housing part and a rear portion, the rear portion comprising a subassembly, the main housing part and the subassembly being separately molded from plastic, the subassembly having a rear end surface, the subassembly comprising at least one opening communicating with the rear end surface, the at least one opening being sized and configured to closely receive an RJ-type modular connector plug, at least the subassembly being compatible with the standards set by the PCMCIA for the thickness of Type III PC cards; and a bottom metal cover panel enclosing the internal cavity.

34. The enclosure defined in claim 33, in which:

the at least one opening is sized and configured to receive an RJ-11 modular connector plug.

35. The enclosure defined in claim 33, in which:

the at least one opening is sized and configured to receive an RJ-45 modular connector plug.

36. The enclosure defined in claim 33, wherein said subassembly includes a contact block for carrying contact wires.

37. The enclosure defined in claim 33, in which:

the subassembly comprises a plurality of side-by-side openings, each of said plurality of openings being sized and configured to receive an RJ-type modular connector plug.

38. The enclosure defined in claim 37, in which:

said plurality of side-by-side openings includes two openings, one of the two openings being sized and configured to receive an RJ-11 modular connector plug and the other of the two openings being sized and configured to receive an RJ-45 modular connector plug.

39. The enclosure defined in claim 37, wherein:

said subassembly further comprises a contact block for carrying contact wires, the contact block including a contact wire section associated with each one of the plurality of openings.

* * * * *